US007613496B2

(12) United States Patent  
Miyazaki et al.

(10) Patent No.: US 7,613,496 B2  
(45) Date of Patent: Nov. 3, 2009

(54) MAGNETIC RESONANCE IMAGING APPARATUS AND MAGNETIC RESONANCE IMAGING METHOD

(75) Inventors: Mitsue Miyazaki, Mount Prospect, IL (US); Hitoshi Kanazawa, Utsunomiya (JP)

(73) Assignees: Kabushiki Kaisha Toshiba, Minato-Ku, Tokyo (JP); Toshiba Medical Systems Corporation, Otawara-Shi, Tochigi-Ken (JP)

( * ) Notice: Subject to any disclaimer, the term of this patent is extended or adjusted under 35 U.S.C. 154(b) by 199 days.

(21) Appl. No.: 11/524,309

(22) Filed: Sep. 21, 2006

(65) Prior Publication Data

US 2007/0083105 A1 Apr. 12, 2007

(30) Foreign Application Priority Data

Sep. 22, 2005 (JP) ............................ P2005-276121

(51) Int. Cl.  
*A61B 5/05* (2006.01)

(52) U.S. Cl. ....................................... 600/419; 324/306

(58) Field of Classification Search ................. 600/410, 600/411, 419; 324/306, 309  
See application file for complete search history.

(56) References Cited

U.S. PATENT DOCUMENTS

| | | | |
|---|---|---|---|
| 6,288,541 B1 * | 9/2001 | Dumoulin | 324/306 |
| 6,781,375 B2 | 8/2004 | Miyazaki et al. | |
| 6,782,286 B2 | 8/2004 | Miyazaki | |
| 6,801,800 B2 | 10/2004 | Miyazaki et al. | |
| 2002/0032376 A1 * | 3/2002 | Miyazaki et al. | 600/410 |
| 2003/0225328 A1 * | 12/2003 | DeMeester et al. | 600/419 |

OTHER PUBLICATIONS

Miyazaki et al., "Phase-Adjusted Fresh Blood Imaging (PA-FBI) as a Non-Contrast Peripheral MRA Technique", Proceedings of the International Society for Magnetic Resonance in Medicine, 14th Meeting Proceedings, May 6, 2006, p. 1934, XP002411480.

Miyazaki et al., "Peripheral MR Angiography: Separation of Arteries from Veins with Flow-Spoiled Gradient Pulses in Electrocardiography—Triggered Three-Dimensional Half-Fourier Fast Spin-Echo Imaging", Radiology, Oak Brook, IL, US, vol. 227, No. 3, Jun. 2003, pp. 890-896, XP009043796.

(Continued)

*Primary Examiner*—Eric F Winakur  
*Assistant Examiner*—Lawrence N Laryea  
(74) *Attorney, Agent, or Firm*—Nixon & Vanderhye PC

(57) ABSTRACT

A magnetic resonance imaging apparatus includes a blood flow velocity acquiring unit that acquires a flow velocity of the blood flow of an object, a capturing condition setting unit that, on the basis of the flow velocity of the blood flow acquired by the blood flow velocity acquiring unit, sets at least one of a transmitting phase of a transmitted exciting pulse, a transmitting phase of a refocusing pulse, a shift amount of the relative phase difference between the transmitted exciting phase and the refocusing pulse, and an intensity of a gradient pulse in a readout direction as a capturing condition, and a blood flow image capturing unit that creates a blood flow image of the object by performing an imaging scan on the basis of the capturing condition set by the capturing condition setting unit.

20 Claims, 9 Drawing Sheets

OTHER PUBLICATIONS

Machida et al., "Analysis of N/z Ghosts in Single-Shot Half-Fourier FSE Flow Imaging", Proceedings of the International Society for Magnetic Resonance in Medicine, Seventh Scientific Meeting and Exhibition, May 22, 1999, XP002411481, Philadelphia, Pennsylvania, USA.

Miyazaki et al., "Nonenhanced Peripheral MR Aortography: Diastolic and Systolic ECG—Triggered Moving-Bed Acquisition", Proceedings of the International Society for Magnetic Resonance in Medicine, Ninth Meeting Proceedings, Apr. 21, 2001, p. 1923, XP002411482.

U.S. Appl. No. 11/790,484, filed Apr. 25, 2007.

David G. Norris, Peter Börnert, Torsten Reese, and Dieter Leibfritz, "On the Application of Ultra-fast RARE Experiments" Magnetic Resonance in Medicine, vol. 27, 142-164(1992).

* cited by examiner

MAGNETIC RESONANCE IMAGING APPARATUS AND MAGNETIC RESONANCE IMAGING METHOD

BACKGROUND OF THE INVENTION

1. Field of the Invention

The present invention relates to a magnetic resonance imaging apparatus which magnetically excites an atomic nuclear spin of an object to be examined by using an RF signal having a Larmor frequency and reconstructs an image on the basis of a magnetic resonance signal generated by the excitation and a method of setting a capturing condition in the magnetic resonance imaging apparatus. More particularly, the invention relates to a magnetic resonance imaging apparatus and a magnetic resonance imaging method that are capable of performing a non-contrast MRA that obtains an image of a blood flow without using a contrast medium.

2. Description of the Related Art

A MRI (magnetic resonance imaging) method is an imaging method that excites an atomic nuclear spin of an object disposed in a magnetostatic field by using an RF (radio frequency) signal having a Larmor frequency and reconstructs the image on the basis of a MR (magnetic resonance) signal generated by the excitation.

In the field of the magnetic resonance imaging, as a method of obtaining an image of a blood flow, MRA (magnetic resonance angiography) is known. An MRI that does not use a contrast medium is referred to as a non-contrast MRA. As the non-contrast MRA, an FBI (fresh blood imaging) method that performs an ECG (electro cardiogram) synchronization to capture a pumping blood flow ejected from the heart, thereby satisfactorily representing a blood vessel (for example, refer to JP-A No. 2000-5144). The FBI method performs a three dimensional scanning that encodes a frequency in a direction substantially equal to a movement direction of the blood vessel by controlling a gradient magnetic field.

As the non-contrast MRA by the FBI method, a flow-spoiled FBI method in which a difference between the image data captured by changing a delay time of the ECG synchronization is obtained so that an MRA image in which an artery and a vein are distinguished from each other is obtained is disclosed. That is, according to the flow-spoiled FBI method, the difference of the artery signal in a diastole and a systole of the cardiac muscle can be imaged.

Further, in the FBI method, in order to extract a blood flow of the low flow velocity, a flow-dephasing method in which a gradient pulse (Gspoil) is applied in a RO (readout) direction, and a dephase pulse or refocusing pulse is applied to a gradient magnetic field pulse is designed (refer to JP-A-2003-135430). According to the flow-dephasing method, due to the dephase pulse or the refocusing pulse, it is possible to increase the relative signal difference between a signal value from the blood flow of high velocity and a signal value from the blood flow of low velocity. Therefore, it is possible to clearly distinguish the artery and the vein from each other on the basis of the relative signal difference.

That is, in order to distinguish the artery and the vein, it is important to increase the difference between signals in the diastole and the systole. In order to increase the difference between signals in the diastole and the systole, it is need to make an intensity of the signal from the blood flow of high velocity in the systole be small. Therefore, the gradient pulse having a proper intensity in the RO direction is set, and the blood flow signal from the artery in the systole is controlled by the set gradient pulse. In this state, the blood flow signal in the diastole is collected. A difference process or an MIP (maximum intensity projection) process is performed on the blood flow signal collected in the diastole, and only the artery is represented.

Further, a flow preparation scan that performs a pre-scan while changing a parameter such as the intensity of the dephase pulse in the RO direction in the flow-dephasing method is designed (for example, see JP-A-2003-70766). In the flow-preparation scan, it is possible to obtain a suitable parameter by referring the captured image while varying the parameter by using the pre-scan. Furthermore, there is a report concerning the intensity of the dephase pulse in the RO direction (for example, see Miyazaki M, et al., Radiology 227: 890-896, 2003).

According to a study of Norris D G, et al., when capturing using the FSE (fast spin echo) method, echoes belonging to two families, that is, an even echo and an odd echo are generated. In this case, when the intensities of the even echo and the odd echo are A and B, respectively, the signal intensity $S_0$ of the reception signal is represented by Equation (1) (for example, see Norris D G, et al., MRM 27: 142-164, 1992).

$$S_0^2 = A^2 + B^2 + 2AB \cos(2\theta) \qquad (1)$$

In this Equation (1), $2\theta$ is a phase difference between the even echo and the odd echo. Further, the even echo belongs to a family that is simultaneously generated with the refocusing of the last spin echo, and the odd echo belongs to a family that is simultaneously generated with the refocusing of the first excited echo.

Further, according to the study of Norris D G, et al., the phase difference $2\theta$ between the even echo and the odd echo is varies due to the influence of the flow velocity, and the phase changed amount $2\phi$ can be represented by Equation (2).

$$2\phi = \gamma G v (TE^2) \qquad (2)$$

In this Equation (2), v indicates the flow velocity in the RO direction, TE indicates the distance of the echo strings, G indicates the intensity of the gradient pulse in the RO direction, and $\gamma$ indicates a coefficient. It can be understood from Equations (1) and (2) that the phase difference $2\theta$ is changed by the phase changed amount $\phi$ due to the influence of the flow velocity v of the blood flow, and the signal intensity $S_0$ may have a loss.

The signal difference of the blood flow signal that is used for imaging in the above FBI method is changed corresponding to the flow velocity. Therefore, in the FBI method according to the related art, it is not always true that the maximum signal difference can be obtained between the diastole and the systole. Specifically, in a portion with a low flow velocity, it is difficult to obtain the blood flow signal with high intensity from the artery as the difference between the diastole and the systole.

Further, in the diastole and the systole, the signal from the vein that is considered to have the same flow velocity is deleted by the difference value between the blood flow signals. However, when the flow velocity of the vein is changed in the diastole or the systole, there is a problem in that the signal of the vein is not completely removed from the difference value in the diastole and the systole.

SUMMARY OF THE INVENTION

Accordingly, this invention is made in consideration of the problems according to the related art, and an object of the present invention is to provide a magnetic resonance imaging apparatus and a magnetic resonance imaging method that are capable of acquiring a signal from the blood flow to be captured with a higher signal intensity and extracting a clearer blood flow image in a non-contrast MRA.

In order to achieve the above object, a magnetic resonance imaging apparatus according to an aspect of this invention includes a blood flow velocity acquiring unit that acquires a flow velocity of the blood flow of an object, a capturing condition setting unit that, on the basis of the flow velocity of the blood flow acquired by the blood flow velocity acquiring unit, sets at least one of a transmitting phase of a transmitted exciting pulse, a transmitting phase of a refocusing pulse, a shift amount of the relative phase difference between the transmitted exciting phase and the refocusing pulse, and an intensity of a gradient pulse in a readout direction as a capturing condition, and a blood flow image capturing unit that creates a blood flow image of the object by performing an imaging scan on the basis of the capturing condition set by the capturing condition setting unit.

A magnetic resonance imaging apparatus according to still another aspect of this invention includes a pre-scanning unit that performs a pre-scan that collects a plurality of reference blood flow images by varying at least one of a transmitting phase of a transmitted exciting pulse, a transmitting phase of a refocusing pulse, a shift amount of the relative phase difference between the transmitted exciting phase and the refocusing pulse, and an intensity of a gradient pulse in a readout direction, a capturing condition setting unit that sets a capturing condition using the transmitting phase of the transmitted exciting pulse, the transmitting phase of the refocusing pulse, the shift amount of the relative phase difference between the transmitted exciting phase and the refocusing pulse, and the intensity of a gradient pulse in a readout direction that are used for an image selected from the plurality of the reference blood flow images, and a blood flow image capturing unit that creates a blood flow image of the object by performing an imaging scan on the basis of the capturing condition set by the capturing condition setting unit.

A magnetic resonance imaging apparatus according to still another aspect of this invention includes a storage unit that stores at least one of a transmitting phase of a transmitted exciting pulse, a transmitting phase of a refocusing pulse, a shift amount of the relative phase difference between the transmitted exciting phase and the refocusing pulse, and an intensity of a gradient pulse in a readout direction so as to be associated with at least one of a capturing condition and a blood flow velocity, a capturing condition determining unit that, on the basis of the at least one of the transmitting phase of the transmitted exciting pulse, the transmitting phase of the refocusing pulse, the shift amount, and the intensity of the gradient pulse that are stored in the storage unit, determines the at least one of the transmitting phase of the transmitted exciting pulse, the transmitting phase of the refocusing pulse, the shift amount of the relative phase difference between the transmitted exciting phase and the refocusing pulse, and the intensity of the gradient pulse in the readout direction corresponding to the blood flow velocity of the object as a capturing condition, an imaging unit that performs a 3 dimensional imaging scan for obtaining a multi-phase MRA image by synchronizing a signal representing a heart phase collected by a time phase detecting unit on the basis of the capturing condition determined by the capturing condition determining unit, and a data processing unit that obtains a differential image by differentiating the multi-phase MRA image obtained by the three dimensional imaging scan.

A magnetic resonance imaging method according to an aspect of the invention includes acquiring a flow velocity of the blood flow of an object, setting, on the basis of the acquired flow velocity of the blood flow, at least one of a transmitting phase of a transmitted exciting pulse, a transmitting phase of a refocusing pulse, a shift amount of the relative phase difference between the transmitted exciting phase and the refocusing pulse, and an intensity of a gradient pulse in a readout direction as a capturing condition, and creating a blood flow image of the object by performing an imaging scan on the basis of the set capturing condition.

A magnetic resonance imaging method according to another aspect of the invention includes performing a pre-scan that collects a plurality of reference blood flow images by varying at least one of a transmitting phase of a transmitted exciting pulse, a transmitting phase of a refocusing pulse, a shift amount of the relative phase difference between the transmitted exciting phase and the refocusing pulse, and an intensity of a gradient pulse in a readout direction, setting a capturing condition using the transmitting phase of the transmitted exciting pulse, the transmitting phase of the refocusing pulse, the shift amount of the relative phase difference between the transmitted exciting phase and the refocusing pulse, and the intensity of a gradient pulse in a readout direction that are used for an image selected from the plurality of the reference blood flow images, and creating a blood flow image of the object by performing an imaging scan on the basis of the capturing condition set by the capturing condition setting unit.

A magnetic resonance imaging method according to a still another aspect of the invention includes storing at least one of a transmitting phase of a transmitted exciting pulse, a transmitting phase of a refocusing pulse, a shift amount of the relative phase difference between the transmitted exciting phase and the refocusing pulse, and an intensity of a gradient pulse in a readout direction so as to be associated with at least one of a capturing condition and a blood flow velocity, determining, on the basis of the at least one of the transmitting phase of the transmitted exciting pulse, the transmitting phase of the refocusing pulse, the shift amount, and the intensity of the gradient pulse that are stored in the storage unit, the at least one of the transmitting phase of the transmitted exciting pulse, the transmitting phase of the refocusing pulse, the shift amount of the relative phase difference between the transmitted exciting phase and the refocusing pulse, and the intensity of the gradient pulse in the readout direction corresponding to the blood flow velocity of the object as a capturing condition, performing a 3 dimensional imaging scan for obtaining a multi-phase MRA image by synchronizing a signal representing a heart phase collected by a time phase detecting unit on the basis of the capturing condition determined by the capturing condition determining unit, and acquiring a differential image by differentiating the multi-phase MRA image obtained by the three dimensional imaging scan.

Therefore, according to a magnetic resonance imaging apparatus and a magnetic resonance imaging method, it is possible to acquire a signal from the blood flow to be captured with a higher signal intensity and extract a clearer blood flow image in a non-contrast MRA.

DETAILED DESCRIPTION OF THE PREFERRED EMBODIMENTS

Embodiments of a magnetic resonance imaging apparatus and a method of setting a capturing condition in the magnetic resonance imaging apparatus according to the invention will be described with reference to accompanying drawings.

Figure 1:
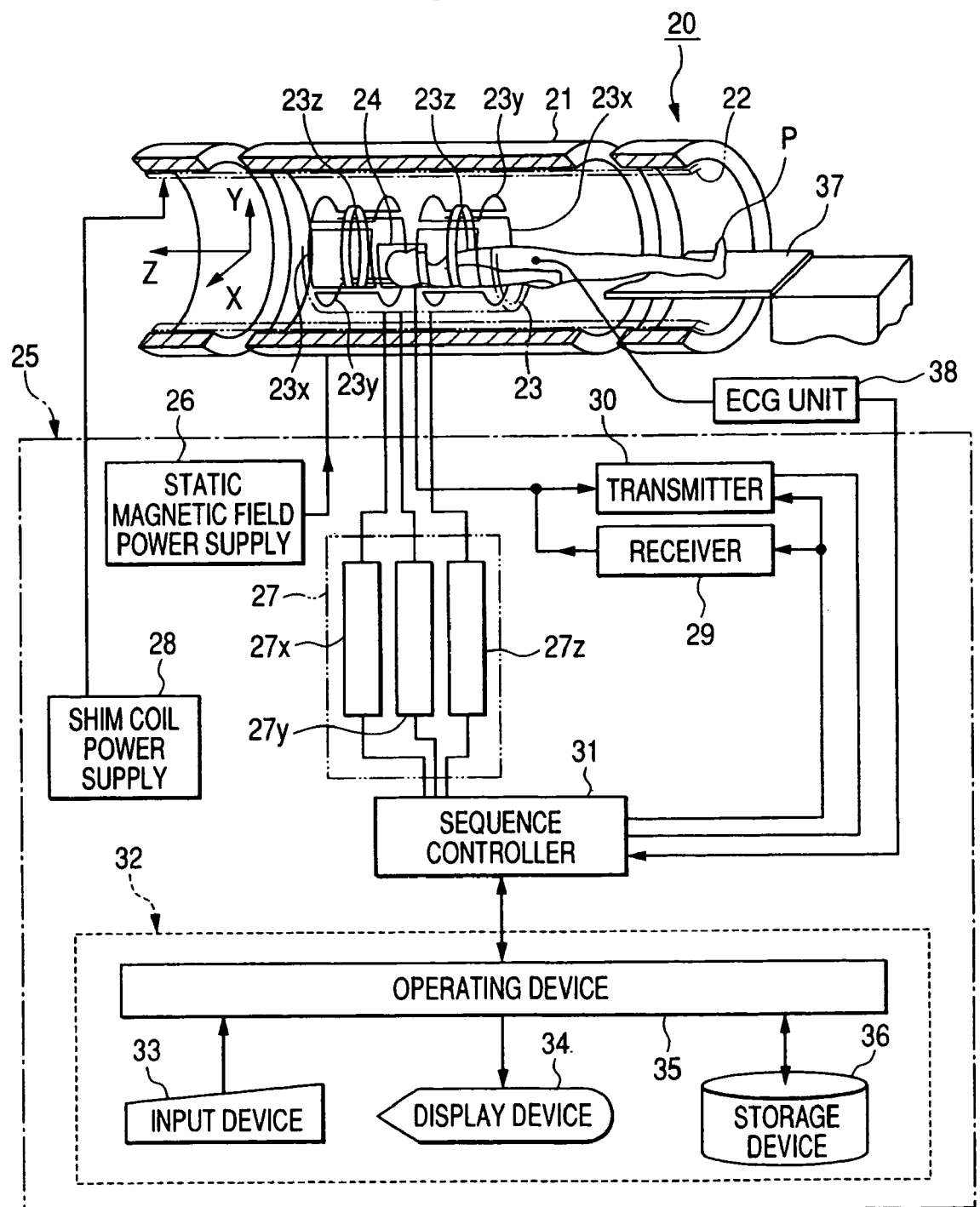
FIG. 1 is a configuration diagram showing a magnetic resonance imaging apparatus according to an embodiment of this invention.

FIG. 1 is a configuration diagram showing a magnetic resonance imaging apparatus according to an embodiment of this invention.

The magnetic resonance imaging apparatus 20 includes a tubular static magnetic field magnet 21 that generates a static magnetic field, a shim coil 22, gradient magnetic field coil unit 23, and a RF coil that are provided in the static magnetic field magnet 21. In this case, the tubular static magnetic field magnet 21, the shim coil 22, gradient magnetic field coil unit 23, and the RF coil 24 are mounted in a gantry that is not shown.

The magnetic resonance imaging apparatus 20 further includes a control system 25. The control system 25 includes a static magnetic field power supply 26, a gradient magnetic field power supply 27, a shim coil power supply 28, a transmitter 29, a receiver 30, a sequence controller 31, and a computer 32. The gradient magnetic field power supply 27 of the control system 25 is configured by an X-axis gradient magnetic field power supply 27x, a Y-axis gradient magnetic field power supply 27y, and a Z-axis gradient magnetic field power supply 27z. Further, the computer 32 includes an input device 33, a display device 34, an operating device 35, and a storage device 36.

The static magnetic field magnet 21 is connected to the static magnetic field power supply 26, and forms a static magnetic field in an imaging region by using a current supplied from the static magnetic field power supply 26. The static magnetic field magnet 21 is often configured by a superconductive coil. The static magnetic field magnet 21 is connected to the static magnetic field power supply 26 to supply a current during the excitation, but is disconnected therefrom after being excited. Further, the static magnetic field magnet 21 is configured by a permanent magnet, and the static magnetic field power supply 26 is not always provided.

The tubular shim coil 22 is coaxially provided inside the static magnetic field magnet 21. The shim coil 22 is connected to the shim coil power supply 28 and a current is supplied from the shim coil power supply 28 to the shim coil 22 so that the static magnet filed is uniform.

The gradient magnetic field coil unit 23 is configured by an X-axis gradient magnetic field coil unit 23x, a Y-axis gradient magnetic field coil unit 23y, and a Z-axis gradient magnetic field coil unit 23z to be tubular inside the static magnetic field magnet 21. A bed 37 is provided inside the gradient magnetic field coil unit 23 to be an imaging region, and an object P to be examined is disposed on the bed 37. The RF coil 24 is not mounted in the gantry, but is possibly provided close to the bed 37 or the object P.

The gradient magnetic field coil unit 23 is connected to the gradient magnetic field power supply 27. In detail, the X-axis gradient magnetic field coil unit 23x, the Y-axis gradient magnetic field coil unit 23y, and the Z-axis gradient magnetic field coil unit 23z of the gradient magnetic field coil unit 23 are connected to the X-axis gradient magnetic field power supply 27x, the Y-axis gradient magnetic field power supply 27y, and the Z-axis gradient magnetic field power supply 27z of the gradient magnetic field power supply 27.

Therefore, by currents supplied from the X-axis gradient magnetic field power supply 27x, the Y-axis gradient magnetic field power supply 27y, and the Z-axis gradient magnetic field power supply 27z to the X-axis gradient magnetic field coil unit 23x, the Y-axis gradient magnetic field coil unit 23y, and the Z-axis gradient magnetic field coil unit 23z, it is possible to form a gradient magnetic field Gx in an X-axis direction, a gradient magnetic field Gy in a Y-axis direction, and a gradient magnetic field Gz in an Z-axis direction in the imaging region.

The RF coil 24 is connected to the transmitter 29 and the receiver 30. The RF coil 24 has a function of receiving an RF signal from the transmitter 29 to transmit to the object P and a function of receiving an MR signal generated by the excitation by the RF signal of the atomic nuclear spin inside the object P to transmit to the receiver 30.

In the meantime, the sequence controller 31 of the control system 25 is connected to the gradient magnetic field power supply 27, the transmitter 29, and the receiver 30. The sequence controller 31 has a function of storing a pulse sequence that describes control information required to drive the gradient magnetic field power supply 27, the transmitter 29 and the receiver 30, for example, operation control information such as an intensity of a pulse current to be supplied to the gradient magnetic field power supply 27, a supplying time of the pulse current, a supplying timing, etc. and a function of generating the X-axis gradient magnetic field Gx, the Y-axis gradient magnetic field Gy, the Z-axis gradient magnetic field Gz, and the RF signal by driving the gradient magnetic field power supply 27, the transmitter 29, and the receiver 30 on the basis of a predetermined stored pulse sequence. The control information that is provided from the sequence controller 31 to the transmitter 29 includes an intensity of the RF pulse current corresponding to a transmitting flip angle or a transmitting phase.

The sequence controller 31 receives row data that is complex data obtained by detection and A/D conversion of the MR signal in the receiver 30 to provide to the computer 32.

Therefore, the transmitter 29 has a function of supplying the RF signal to the RF coil 24 on the basis of the control information received from the sequence controller 31, and the receiver 30 has a function of generating raw data that is digitalized complex data by detecting the MR signal received from the RF coil 24 to perform a predetermined signal process and A/D conversion and a function of supplying the generated raw data to the sequence controller 31.

That is, by using the respective components of the static magnetic field magnet 21, the shim coil 22, the gradient magnetic field coil unit 23, the RF coil 24, and the control system 25, the magnetic resonance imaging apparatus 20 functions as a raw data acquisition unit that supplies the gradient magnetic field to the object P in the static magnetic field, transmits the RF signal to the object in the static magnetic field, on the basis of each of capturing conditions set as pulse sequences, receiving and digitalizing an MR signal generated by the nuclear magnetic resonance by the RF signal inside the object P to create raw data.

Further, the magnetic resonance imaging apparatus 20 includes an ECG unit 38 that acquires an ECG signal of the object P. The ECG signal acquired by the ECG unit 38 is output to the computer 32 through the sequence controller 31.

By performing a program stored in the storage device 36 of the computer 32 in the operating device 35, the computer 32 performs various functions. However, the computer 32 can be configured by a specific circuit, not by a program.

Figure 2:
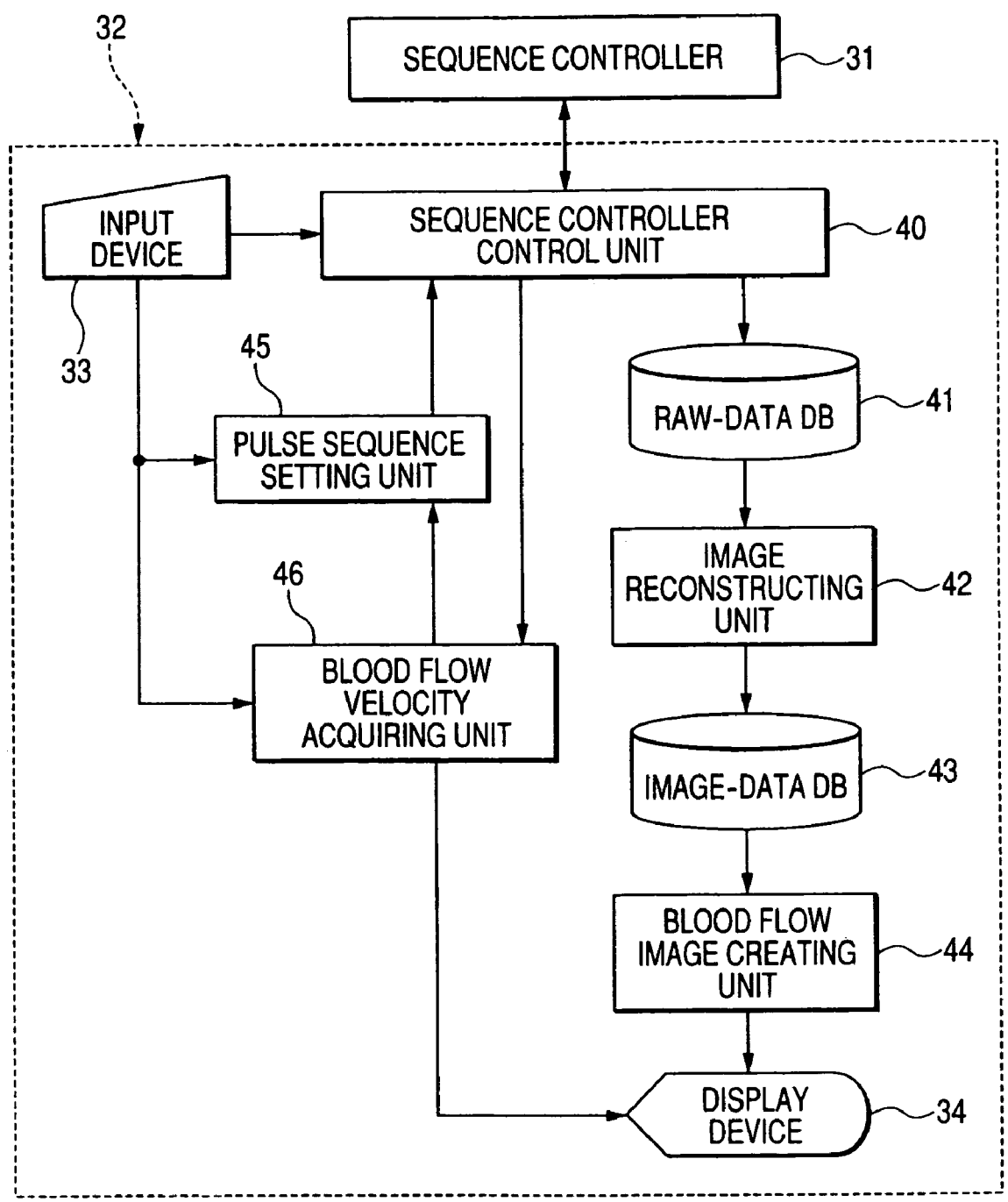
FIG. 2 is a functional block diagram of a computer of the magnetic resonance imaging apparatus shown in FIG. 1.

FIG. 2 is a functional block diagram of the computer 32 in the magnetic resonance imaging apparatus 20 shown in FIG. 1.

The computer 32 functions as a sequence controller control unit 40, a raw-data database 41, an image reconstructing unit 42, an image-data database 43, a blood flow image creating unit 44, a pulse sequence setting unit 45, and a blood flow velocity acquiring unit 46.

The sequence controller control unit 40 has a function of controlling the sequence controller 31 by inputting a predetermined pulse sequence received from the pulse sequence setting unit 45 to the sequence controller 31 on the basis of information from the input device 33 or other components, and a function of receiving raw data from the sequence controller 31 to arrange the raw data in a k space (Fourier space) formed in the raw-data database 41. In this case, the sequence controller control unit 40 controls the sequence controller 31 so as to perform an ECG gated scan on the basis of the ECG signal acquired by the ECG unit 38.

Therefore, raw data created in the receiver 30 is stored in the raw-data database 41 to be disposed in the k space formed in the raw-data database 41.

The image reconstructing unit 42 has a function of receiving raw data from the raw-data database 41 and performing predetermined image reconstruction such as a three dimensional Fourier transformation to reconstruct three dimensional image data of the object P and write into the image-data database 43. However, it is further preferable to reconstruct 3D image data after temporally creating intermediate data such as 2D image data by performing 2D Fourier transformation.

Therefore, 3D image data of the object is stored in the image-data database 43.

The blood flow image creating unit 44 has a function of removing vein data and extracting artery data as the blood flow image data by reading 3D image data in a diastole and a systole of the cardiac muscle from the image-data database 43 and performing a difference process. The blood flow image creating unit 44 may have a function of creating the vein data for the blood flow image from the extracted artery data and the 3D image data in the diastole.

Therefore, it is possible to create the vein data and the artery data so as to perform color display of the blood flow image using the vein data and the artery data. For example, if the blood flow image data is created such that the artery data is red and the vein data is blue, it is possible to distinguish the artery and the vein in the blood flow image.

When the blood flow image is displayed such that the artery is red and the vein is blue, data obtained by performing the difference process on the 3D image data in the diastole and the systole is artery data. Therefore, it is possible to assign red information to data having a signal value that exceeds a threshold value as the artery data. Further, since 3D image data in the diastole has both artery data and vein data, blood flow data except the artery data to which red information is assigned by performing the above-mentioned difference process from the 3D image data in the diastole is vein data. Accordingly, it is possible to assign blue information to data except the artery data among the 3D blood flow image data in the diastole as the vein data.

The 3D image data in the diastole includes data from joint fluid having long transverse relaxation time T2 in addition to the vein data. Since data from organs or tissue in which the time T2 is long occasionally has a signal value larger than that of the vein data, the data may be misunderstood as the vein data. Therefore, if data whose signal value is within a predetermine range is detected from the 3D image data as the vein data, it is possible to avoid misunderstanding the vein data. Specifically, it is possible to detect data other than artery dada having signal value that is 50 to 70% of a threshold value from the 3D image data as the vein data.

A function of detecting the artery data by the difference process, a function of detecting the vein data by the threshold process, and a function of allocating color information to the artery data and the vein data can be provided to the blood flow image creating unit 44.

The blood flow image creating unit 44 further has a function of performing various processes such as an MIP process on the blood flow image if necessary. Furthermore, the blood flow image creating unit 44 also has a function of displaying the final blood flow image on the display device 34.

However, the blood flow image creating unit 44 may create a blood flow image on the basis of raw data read from the raw-data database 41 without providing the image reconstructing unit 42. Further, if it is useful for a clinical purpose, it is possible to create 3D images including an MIP image, an SVR (shaded volume rendering) image, etc. as the blood flow image.

That is, the magnetic resonance imaging apparatus 20 is provided with a function of creating a blood flow image on the basis of raw data by using the image reconstructing unit 42 or the blood flow image creating unit 44.

The pulse sequence setting unit 45 has a function of setting a pulse sequence as a capturing condition, and a function of allowing scan according to a predetermined capturing condition by inputting the set pulse sequence to the sequence controller control unit 40. In this case, when setting the pulse sequence, the pulse sequence setting unit 45 sets the pulse sequence corresponding to the flow velocity, in reference to the velocity of the blood flow received from the blood flow velocity acquiring unit 46. Specifically, the pulse sequence setting unit 45 has a function of setting one or both a phase of an RF pulse serving as a parameter when setting the pulse sequence and the gradient pulse G in an RO direction so as to have an appropriate value in response to the velocity of the blood flow.

In detail, the pulse sequence setting unit 45 separates the vein and the artery from each other and sets the pulse sequence so as to obtain the blood flow image that satisfactorily represents the artery and the vein. As described above, in order to satisfactorily represent the artery and the vein, it is important to extract a signal from the artery with a high intensity by making the difference between signals from the artery in the diastole and the systole of the cardiac muscle be larger, and the difference between signals the vein be smaller, and performing the difference process on the blood flow signal in the diastole and the systole.

Therefore, the intensity of the blood flow signal changes corresponding to the flow velocity. According to Equation (2) derived by Norris D G, etc., the phase difference $2\theta$ between two echoes in Equation (1) is changed by $2\phi$ ($=\gamma Gv$ ($TE^2$)) due to the flow velocity v. Therefore, a complementary signal intensity S corresponding to the flow velocity v from Equations (1) and (2) is represented by Equation (3).

$$S = sqrt\{A^2 + B^2 + 2AB \cos 2(\phi + d\phi)\} \quad (3)$$

In this equation, A, B indicates intensities of two echo, $d\phi$ indicates a shift amount of the phase difference ($\theta - \phi$) between the two echo. When the shift amount $d\phi$ of the phase difference between the two echoes is set as a parameter, the relationship between the intensity S of the image signal and the flow velocity v can be adjusted. In order word, even though the phase difference $\phi$ is changed corresponding to the value of the flow velocity v, if the phase shift amount $d\phi$ is set, it is possible to adjust the signal intensity S.

Further, the phase difference between two echoes corresponds a phase difference between a exciting pulse to be transmitted from the RF coil 24 and a refocusing pulse following the exciting pulse. Therefore, when the transmitting phase of the exciting pulse or the refocusing pulse is shifted by $d\phi$, it is possible to set $d\phi$ in Equation (3).

It is known that when a transmitting pulse string configured by an exciting pulse and a refocusing pulse is formed by a pulse string according to a CPMG (Carr-Purcell Meiboom-Gill sequence) series, a stable echo signal can be obtained. The CPMG pulse series is a pulse series in which a direction of a magnetization vector in a stable state is a Z-direction, a direction of applying the RF pulse is represented in an XY plane, and the phases of the exciting pulse and the refocusing pulse following the exciting pulse are X(0°), Y(90°), Y(90°), and Y(90°). In this case, the angles in the parentheses indicate an angle between the X-axis in the XY direction and the direction of applying the RF pulse.

Therefore, a transmitting phase of the exciting pulse or the refocusing pulse is shifted by $d\phi$. If the transmitting phase of the refocusing pulse is shifted by $d\phi$, the phase of the refocusing pulse is inclined from the Y-axis by an angle corresponding to the phase shift amount $d\phi$. Similarly, even when the transmitting phase of the exciting pulse is shifted, the phase shift amount $d\phi$ is represented by an angle from the X-axis.

For example, when the transmitting phase of the exciting pulse is shifted, the transmitting phases of the exciting pulse and a plurality of refocusing pulses following the exciting pulse are $d\phi$, 90°, 90°, 90°, .... Further, when the transmitting phase of the refocusing pulse is shifted, the transmitting phases of the exciting pulse and the plurality of the refocusing pulse following the exciting pulses are 0°, 90°–$d\phi$, 90°–$d\phi$, 90°–$d\phi$, ....

With the above-mentioned relationship, the phase shift amount is referred to as an angle offset. Herein below, reference symbol $d\phi$ is referred to as an angle offset.

However, regardless whether the transmitting pulse string is a CPMG series, when the angle offset $d\phi$ is set as a shift amount for a complementary phase difference between the exciting pulse and the refocusing pulse, it is possible to control the signal intensity S.

The control of the transmitting phase of the exciting pulse and the refocusing pulse in order to set the angle offset $d\phi$ can be performed in the transmitter 29.

Figure 3:
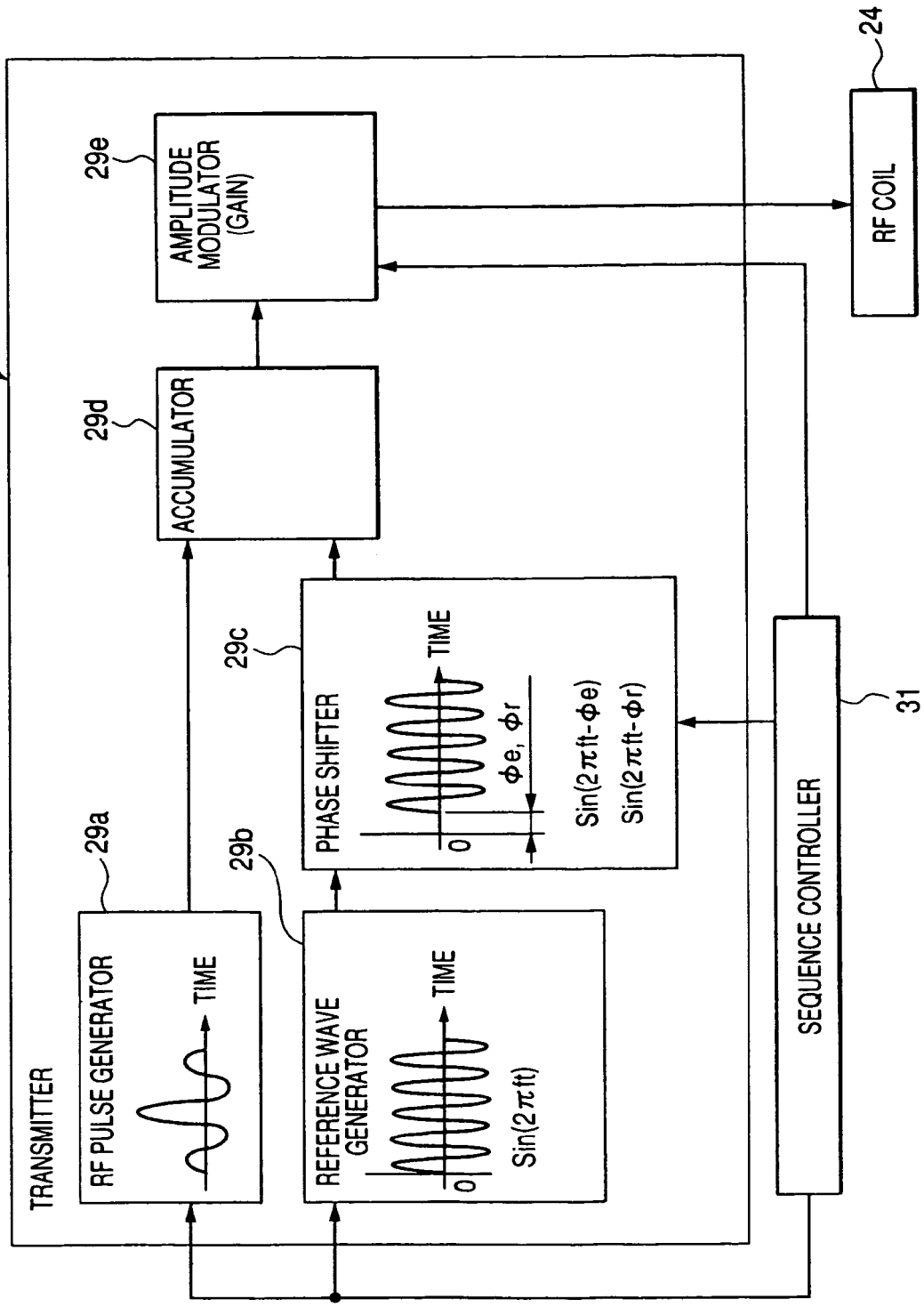
FIG. 3 is a detailed diagram showing a transmitter shown in FIG. 1.

FIG. 3 is a detailed diagram showing the transmitter 29 shown in FIG. 1.

Referring to FIG. 3, the transmitter 29 includes a pulse generator 29a, a reference wave generator 29b, a phase shifter 29c, an accumulator 29d, and an amplitude modulator (gain) 29e. However, a component having low relevance to the control of the transmitting waves of the exciting pulse and the refocusing pulse.

The pulse generator 29a generates pulse signals for the exciting pulse and the refocusing pulse on the basis of a control signal from the sequence controller 31. Therefore, the pulse signal is input from the pulse generator 29a to the accumulator 29d. The reference wave generator 29b generates a reference continuous wave (hereinafter, referred to as reference wave) $\sin(2\pi ft)$ having a frequency for generating the exciting pulse and the refocusing wave, on the basis of the control signal from the sequence controller 31. And then, the reference wave $\sin(2\pi ft)$ is input from the reference wave generator 29b to the phase shifter 29c.

In the phase shifter 29c, the phase of the reference wave is shifted by $\phi_e$ in the case of generating the exciting pulse and is shifted by $\phi_r$ in the case of generating the refocusing pulse, on the basis of the control signal from the sequence controller 31. Therefore, the shifted waves become an exciting pulse generating carrier wave $\sin(2\pi ft - \phi_e)$ and a refocusing pulse generating carrier wave $\sin(2\pi ft - \phi_r)$, respectively. As a result, the phase differences ($\phi_e - \phi_r$) of both shifted waves is controlled so as to have a phase difference ($\theta_0 - d\phi$) that is smaller than the phase difference $\theta_0$ of the original exciting pulse and the refocusing wave by an angle offset $d\phi$.

Next, the exciting pulse generating carrier wave $\sin(2\pi ft - \phi_e)$ and the refocusing pulse generating carrier wave $\sin(2\pi ft - \phi_r)$ whose phases are controlled are input from the phase shifter 29c to the accumulator 29d. In the accumulator 29d, the exciting pulse generating carrier wave $\sin(2\pi ft - \phi_e)$ and the refocusing pulse generating carrier wave $\sin(2\pi ft - \phi_e)$ whose phases are controlled are accumulated with the pulse signal received from the pulse generator 29a. As a result, the generated exciting pulse and the refocusing pulse are input from the accumulator 29d to the amplitude modulator 29e.

Next, in the amplitude modulator 29e, the amplitudes of the exciting pulse and the refocusing pulse are controlled so as to correspond to a flip angle such as 90°, 180° on the basis of the control signal from the sequence controller 31. The generated exciting pulse and the refocusing pulse for transmitting are supplied from the transmitter 29 to the RF coil 24, and transmitted to the object P as RF signals.

As described above, by controlling the control signal output from the sequence controller 31 to the phase shifter 29c of the transmitter 29, the transmitting phase one or both of the exciting pulse and the refocusing pulse is controlled. Therefore, it is possible to substantially control the angle offset $d\phi$.

Next, a method of setting a capturing condition including the angle offset $d\phi$.

Figure 4:
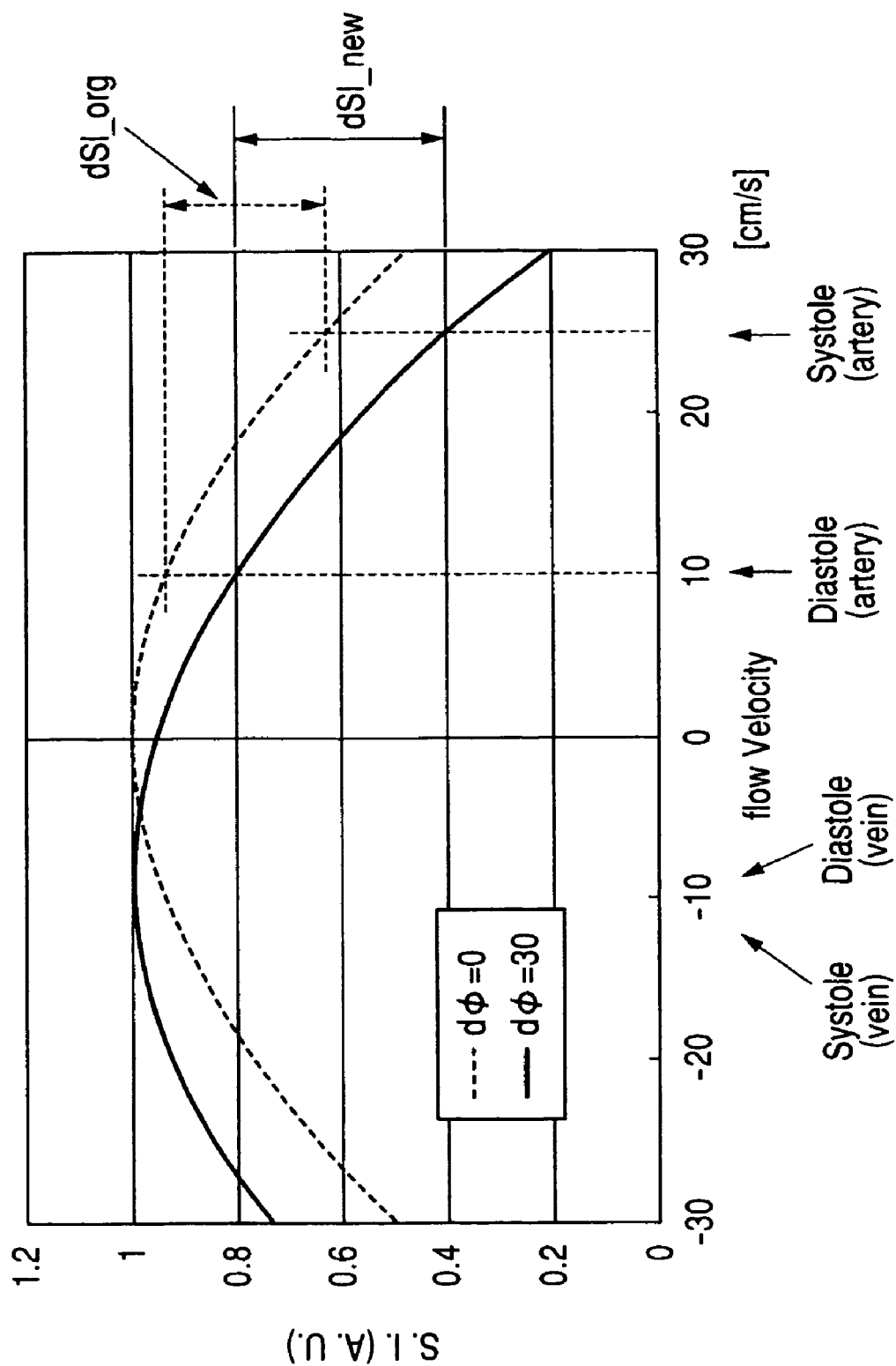
FIG. 4 is a diagram showing a method of setting when a pulse sequence setting unit 45 shown in FIG. 2 sets a capturing condition on the basis of a velocity of a blood flow.

FIG. 4 is a diagram showing a method of setting when a pulse sequence setting unit 45 shown in FIG. 2 sets a capturing condition on the basis of a velocity of a blood flow.

Referring to FIG. 4, a horizontal axis represents a flow velocity (cm/s) of the blood flow, and a vertical axis represents a relative signal intensity S. In this case, the signal intensity S is an arbitrary unit. Further, the solid line in FIG. 4 represents a simulation result of Equation (3) when the angle offset $d\phi$ is 0 ($d\phi$=0). The dotted line in FIG. 4 represents a simulation result of Equation (3) when the angle offset $d\phi$ is 30 ($d\phi$=30). In the respective simulations, when assuming that a dephasing effect is ignored in a voxel during the simulation, A=B=0.5.

Further, the other conditions are as follows:

RF coil 24 of 1.5 T: body quadrature detection (QD) having 8 channels

TR (repetition time): 3 heart beats

TEff (effective echo time)=80 msec

ETS (echo-train spacing)=5 msec and 256×256 matrix

TI (interval time)=130 msec

NAQ (number of acquisition)=1

Slice thickness=4 mm

The number of slices: 26 pieces

FOV (field of view)=40×40 cm

Total scan time: 3 hours 50 minutes to 4 hours

Referring to FIG. 4, in the artery of the ilium region, when the angle offset $d\phi$ is 0, the signal value from the artery in the systole whose flow velocity is 25 cm/sec, which is comparatively fast as represented by the dotted line, is approximately 0.65, and the signal value from the artery in the diastole whose flow velocity is 10 cm/sec is approximately 0.95. Therefore, the intensity difference dS I_org of the signal from the artery is approximately 0.3. Further, the signal value from the vein is about 0.9 in any of the systole and the diastole.

When the angle offset is set that $d\phi$=30, the simulation data represented by the dotted line is shift to a negative side of the vertical axis, and the simulation data represented by the solid line is obtained. When the angle offset $d\phi$ is 30, the signal value from the artery in the systole whose flow velocity is 25 cm/sec as represented by the solid line is approximately 0.40, and the signal value from the artery in the diastole whose flow velocity is 10 cm/sec as represented by the solid line is approximately 0.80. Therefore, the intensity difference dSI_new of the signal value from the artery is approximately 0.4. Further, the signal value from the vein is about 1.0 in any of the systole and the diastole.

Therefore, when the angle offset is set that $d\phi$=30, the intensity difference of the signal value from the artery increases. Therefore, it is possible to satisfactorily represent the blood flow image. In the simulation of FIG. 4, when the angle offset $d\phi$ is 30, the intensity difference of the signals from the vein in the systole and the diastole is 36% larger than that when the angle offset $d\phi$ is 0.

When the intensity difference of the signals from the vein in the systole and the diastole is comparatively small, and the angle offset $d\phi$ is 30, the intensity difference of signals from the vein in the systole and the diastole becomes smaller than that when the angle offset $d\phi$ is 0. Therefore, it is possible to satisfactorily remove a signal from the vein by performing the difference process on the blood flow signal. Further, a difference is generated between the intensity of a signal from the vein and the intensity of a signal from the artery, the vein ad the artery are easily separated by performing the difference process on the signal. As a result, it is possible to reduce a contamination of the vein signal with respective to the artery signal.

When the angle offset $d\phi$ is 0, in a state when a gradient pulse having an intensity G is applied in an RO direction, two echoes having a phase difference corresponding to the flow velocity v as represented in Equation (2) are generated. In other word, the transmitting pulse string is deviated from the CPMG series that is known as a transmitting pulse series obtaining a stable echo signal by an amount corresponding to the flow velocity v and the intensity G of the gradient pulse. Due to the two echo, in the blood flow image whose flow velocity is fast in the systole, N/2 artifacts are repeatedly generated in a phase encode direction. The same phenomenon is reported to be occurred in a clinical case that the flow velocity of the blood flow at a main artery forwarding the ilium region or a branch portion from the main body to the popliteal region is drastically changed.

Therefore, it is important to set the capturing condition so as to remove the N/2 artifact. For this, when the angle offset $d\phi$ is set so as to reduce the deviation of the 90° exciting pulse and the refocusing pulse whose phase is shifted from the CMPG series by $\phi$ due to the flow velocity v, it is possible to reduce the N/2 artifact.

The parameter that is capable of optimizing the capturing condition includes the intensity of the gradient pulse in addition to the angle offset $d\phi$. Since the angle offset $d\phi$ is supplied as an offset (difference), when the angle offset $d\phi$ is changed, the simulation curve shown in FIG. 4 is shifted in the horizontal axis (flow velocity axis). Further, since the intensity G of the gradient pulse is multiplied by the flow velocity v, the ratio (inclination) of change of the simulation curve shown in FIG. 4 is changed corresponding to the change of the intensity G.

With the above property, the maximum signal intensity S in the flow velocity of the vein can be obtained by adjusting the angle offset $d\phi$. Further, the capturing condition can be set so as to keep a predetermined value of the intensity of the signal from the artery in the systole by adjusting the intensity G of the gradient pulse. In FIG. 4, the relative intensity S of the signal from the vein is 1, and the lowest limit of the relative intensity S of the signal from the artery in the systole is 0.4.

However, when using the velocity of the blood flow, the angle offset $d\phi$ and the intensity G of the gradient pulse may be determined on the basis of conditions other than the above method.

Figure 5:
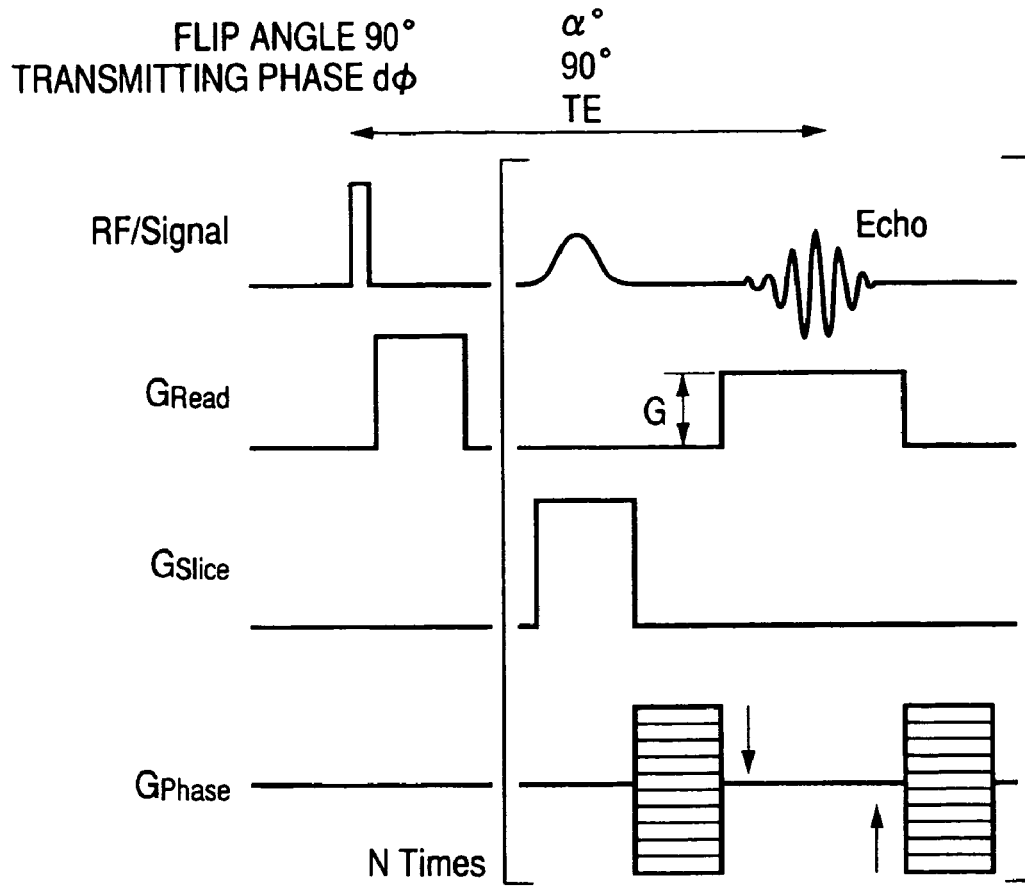
FIG. 5 is a diagram showing an example of an FSE sequence set by the pulse sequence setting unit shown in FIG. 2.

FIG. 5 is a diagram showing an example of an FSE sequence set by the pulse sequence setting unit 45 shown in FIG. 2.

As shown in FIG. 5, in the case of the FSE sequence, a $\alpha°$ refocusing pulse follows the 90° exciting pulse. The transmitting phase of the 90° exciting pulse is set to have a value shifted from 0° by the angle offset $d\phi$, and a transmitting pulse of the $\alpha°$ refocusing pulse is 90°. Therefore, an echo signal is obtained after the lapse of TE from the time of applying the 90° exciting pulse. The intensity G of the gradient pulse in the RO direction that is applied at the time of reception of the echo signal can be set depending on the flow velocity. The gradient pulses $G_{slice}$ and $G_{phase}$ in a slice direction and a phase encode direction are set to intended values, respectively.

It is preferable to set various sequence such as an SE (spin echo) sequence, an EPI (echo planar imaging) pulse, an FASE (fast asymmetric SE) in which an half Fourier method is combined with the FSE method in addition to the FSE sequence.

In order to set the angle offset $d\phi$ and the intensity G of the gradient pulse, the pulse sequence setting unit 45 obtains a flow velocity of the vein or the artery in the systole or the diastole from the blood flow velocity acquiring unit 46.

The blood flow velocity acquiring unit 46 has a function of acquiring the flow velocity of the vein or the artery in the systole or the diastole, and a function of notifying the acquired flow velocity of the blood flow to the pulse sequence setting unit 45. A method of acquiring the flow velocity includes a method of acquiring the flow velocity as input information from a user or a method of acquiring the flow velocity by scanning. When acquiring the flow velocity as the input information from a user, the blood flow velocity acquiring unit 46 displays an input field of the flow velocity on the display device 34, and acquires the flow velocity as input information from the input device 33. In this case, the user previously measures the flow velocity of the blood flow of the object P using an arbitrary method.

Further, it is possible to obtain the flow velocity by performing a scan for measuring the flow velocity of the blood flow that is represented by a scan using a PC (phase contrast) method. In this case, the blood flow velocity acquiring unit 46 can supply an indication of performing a scan for measuring the flow velocity of the blood flow to the pulse sequence setting unit 45. Therefore, the pulse sequence setting unit 45 supplies a pulse sequence that performs the scan for measuring the flow velocity of the blood flow to the sequence controller control unit 40 to perform the scan. Data obtained by the scan for measuring the flow velocity is supplied to the blood flow velocity acquiring unit 46 through the sequence controller control unit 40, and the value of the flow velocity can be obtained in the blood flow velocity acquiring unit 46.

Next, the operation and the function of the magnetic resonance imaging apparatus 20 will be described.

Figure 6:
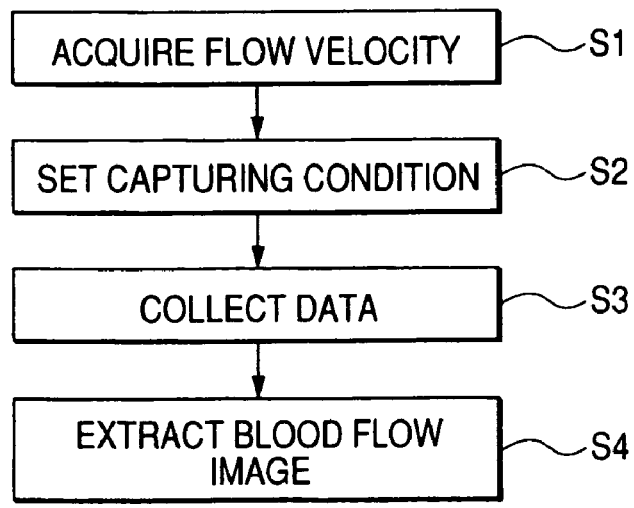
FIG. 6 is a flow chart showing a flow of imaging an MRA image using the magnetic resonance imaging apparatus shown in FIG. 1 while setting a phase of the transmitting pulse on the basis of the velocity of the blood flow.

FIG. 6 is a flow chart showing a flow of imaging an MRA image using the magnetic resonance imaging apparatus 20 shown in FIG. 1 while setting a phase of the transmitting pulse on the basis of the velocity of the blood flow. Reference symbols attached with numerals in FIG. 6 indicate respective steps of the flow chart.

First, in step S1, the flow velocity of the blood flow of the object P is obtained. For example, the blood flow velocity acquiring unit 46 supplies input field information of the flow velocity to the display device 34 to display it. Therefore, a user inputs the flow velocity using the input device 33. Thereby, the blood flow velocity acquiring unit 46 obtains the flow velocity. If the flow velocity of the vein is input, it is possible to determine the angle offset $d\phi$ by using the above method, on the basis of the flow velocity of the vein.

Further, according to another example, the indication of performing a PC scan is supplied from the blood flow velocity acquiring unit 46 to the pulse sequence setting unit 45. Thereby, the pulse sequence setting unit 45 supplies a PC pulse sequence for performing the PC scan to the sequence controller control unit 40. The sequence controller control unit 40 controls the driving of the sequence controller 31 by supplying the PC pulse sequence to the sequence controller 31.

Further, the object P is disposed on the bed 37 at this time, the static magnetic field is formed in the imaging region of the static magnetic field magnet 21 (superconductive magnet) that is excited by the static magnetic field power supply 26. A current is supplied from the shim coil power supply 28 to the shim coil 22 to uniform the static magnetic field formed in the imaging region.

Next, the sequence controller 31 forms the X-axis gradient magnetic field Gx, the Y-axis gradient magnetic field Gy, and the Z-axis gradient magnetic field Gz in the imaging region in which the object P is set by driving the gradient magnetic field power supply 27, the transmitter 29, and the receiver 30 on the basis of the PC pulse sequence received from the sequence controller control unit 40, and generates the RF signal. That is, the RF signal is sequentially supplied from the transmitter 29 to the RF coil 24 on the basis of the PC pulse sequence, and the RF signal is transmitted from the RF coil 24 to the object P.

The MR signal generated together with the transmitted RF signal is received by the RF coil 24. When the MR signal is received by the RF coil 24, the receiver 30 receives the MR signal from the RF coil 24 to perform various signal processings such as pre-amplification, intermediate frequency conversion, phase detection, low frequency amplification, and filtering. Further, the receiver 30 performs the A/D conversion of the MR signal to generate raw data that is a digital MR signal. The receiver 30 supplies the generated raw data to the sequence controller 31.

The raw data is acquired by performing an ECG gated scan on the basis of the ECG signal acquired by the ECG unit 38. Therefore, raw data in the systole and the diastole of the cardiac muscle is acquired.

The sequence controller 31 supplies the raw data received from the receiver 30 to the sequence controller control unit 40, and the sequence controller control unit 40 supplies the raw data obtained by the PC scan to the blood flow velocity acquiring unit 46. The blood flow velocity acquiring unit 46 obtains the phase shift of the blood flow using the phase image obtained from the raw data to calculate the flow velocity of the blood flow.

The flow velocity obtained according to the above mentioned method is supplied from the blood flow velocity acquiring unit 46 to the pulse sequence setting unit 45.

Next, in step S2, the pulse sequence setting unit 45 sets the angle offset $d\phi$ and the intensity G of the gradient pulse in the RO direction, on the basis of the flow velocity of the blood flow received from the blood flow velocity acquiring unit 46 so that the intensity difference between the signals from the artery in the systole and the diastole is large, the intensity difference of the signals from the vein is small, and the relative signal intensity from the artery has an arbitrary value.

For example, the angle offset $d\phi$ and the intensity G of the gradient pulse in the RO direction is automatically set by the pulse sequence setting unit 45 so that the relative intensity S of the signal from the vein is 1, and the lowest limit of the relative intensity S of the signal from the artery in the systole is 0.4.

Therefore, the pulse sequence setting unit 45 creates a pulse sequence on the basis of the set angle offset $d\phi$ and the set intensity G of the gradient pulse in the RO direction. Further, the pulse sequence setting unit 45 supplies the created pulse sequence to the sequence controller control unit 40.

Next, in step S3, the scan is performed and scanned data is collected. When a scan start command is supplied from the input device 33 to the sequence controller control unit 40, the pulse sequence from the sequence controller control unit 40 is output to the sequence controller 31. The sequence controller 31 controls the gradient magnetic field power supply 27, the transmitter 29, and the receiver 30 on the basis of the pulse sequence received from the sequence controller 40, and collects the raw data.

The raw data is acquired by performing an ECG gated scan on the basis of the ECG signal acquired by the ECG unit 38. Therefore, raw data in the systole and the diastole of the cardiac muscle is acquired.

The sequence controller 31 supplies the collected raw data to the sequence controller control unit 40, and the sequence controller control unit 40 arranges the raw data in the k space formed in the raw-data database 41.

Next, in step S4, the raw data stored in the raw-data database 41 is used as original data to generate a blood flow image and display it. That is, the image reconstructing unit 42 reconstructs the 3D image data by performing a predetermined reconstructing process such as 3 dimensional Fourier formation on the raw data from the raw-data database 41. The image reconstructing unit 42 writes the generated 3D image data into the image-data database 43.

Next, the blood flow image creating unit 44 reads the 3D image data in the systole and the diastole of the cardiac muscle from the image-data database 43, and performs the difference process to remove the vein data and extract the artery data. In here, by appropriately setting the angle offset $d\phi$ and the intensity G of the gradient pulse in the RO direction, the signal intensity of the 3D image data in the systole and the diastole has a large intensity difference of the data from the artery and a small intensity difference of the data from the vein. Therefore, by performing the difference process, the signal intensity of the data from the artery is sufficient, and the data from the vein is satisfactorily removed. Therefore, the separation of the vein and the artery is precisely performed.

The blood flow image creating unit 44 detects data except artery data having a signal value within the threshold value among the 3D image data in the diastole as vein data. That is, by setting the upper limit of the signal value in addition to the lowest limit, vein data is detected from the 3D image data while removing data such as a joint fluid whose T2 is long and signal value is large.

Further, the blood flow image creating unit 44 performs an MIP process on the artery data obtained by the difference process and the vein data obtained by the threshold process. In this case, the blood flow image creating unit 44 allocates red information to the MIP processed artery data and blue information to the MIP processed vein data. Therefore, the MIP image including the artery data and the vein data created by the MIP process is supplied from the blood flow image creating unit 44 to the display device 34 as the blood flow image data for display. The artery and the vein are displayed on the display device 34 as the blood flow image. In this case, since the artery is red and the vein is blue, it is possible to visually distinguish the artery and the vein from each other.

Figure 7:
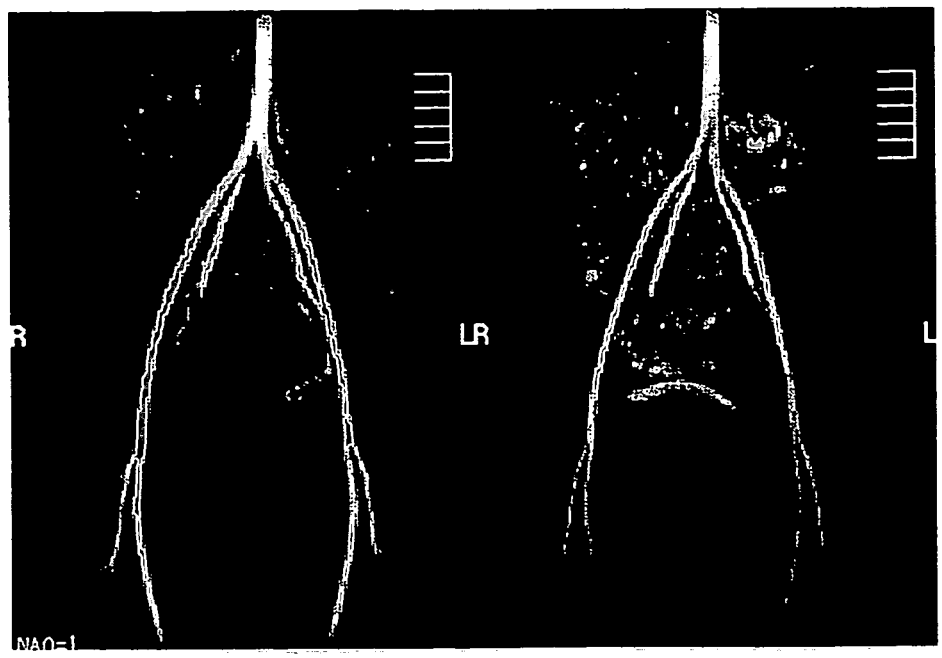
FIG. 7 is a diagram comparing an MIP image of an artery of an ilium region obtained by optimizing an angle offset dφ using the magnetic resonance imaging apparatus shown in FIG. 1 with an MIP image of an artery obtained according to a related art without setting an angle offset dφ.

FIG. 7 is a diagram comparing the MIP image of the artery of the ilium region obtained by optimizing the angle offset $d\phi$ using the magnetic resonance imaging apparatus 20 shown in FIG. 1 with an MIP image of an artery obtained according to a related art without setting an angle offset $d\phi$.

A left image of FIG. 7 is the MIP image obtained by appropriately setting the angle offset $d\phi$, and a right image is an MIP image obtained according to a related art without setting an angle offset $d\phi$. In this case, the intensity G of the gradient pulse in the RO direction is −10%.

Referring to FIG. 7, by appropriately setting the angle offset $d\phi$, the signal intensity from the artery is uniformly increased as compared with the case without setting the angle offset $d\phi$, and the N/2 artifact is reduced.

Figure 8:
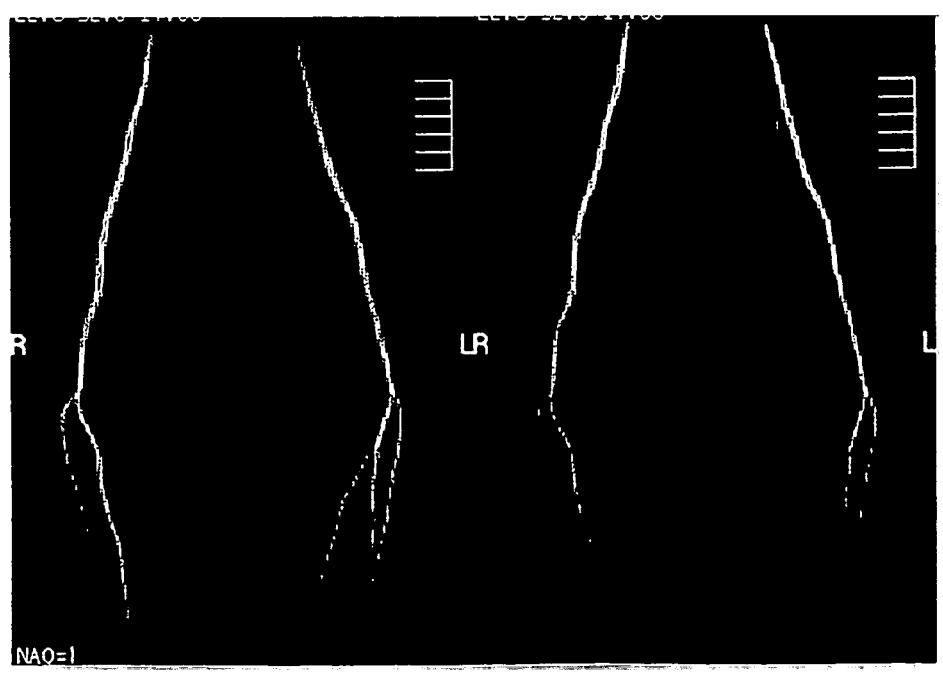
FIG. 8 is a diagram comparing an MIP image of an artery branched from a popliteal region obtained by optimizing an angle offset dφ using the magnetic resonance imaging apparatus shown in FIG. 1 with an MIP image of an artery obtained according to a related art without setting an angle offset dφ.

FIG. 8 is a diagram comparing an MIP image of an artery branched from a popliteal region obtained by optimizing the angle offset $d\phi$ using the magnetic resonance imaging apparatus 20 shown in FIG. 1 with an MIP image of an artery obtained according to a related art without setting an angle offset $d\phi$.

A left image of FIG. 7 is the MIP image obtained by appropriately setting the angle offset $d\phi$, and a right image is an MIP image obtained according to a related art without setting an angle offset $d\phi$. In this case, the intensity G of the gradient pulse in the RO direction is +10%.

Referring to FIG. 7, by appropriately setting the angle offset $d\phi$, the signal intensity from the artery is increased as compared with the case without setting the angle offset $d\phi$, but the signal intensity from the vein is suppressed.

From the above results, by appropriately setting the angle offset $d\phi$ in addition to the intensity G of the gradient pulse in the RO direction, on the basis of the flow velocity, it is possible to satisfactorily represent the artery and to reduce the N/2 artifact.

Further, it is known that the N/2 artifact is caused by the increase of the phase difference $2(\phi+d\phi)$ between two echo components due to the flow velocity. However, when the phase difference $2(\phi+d\phi)$ is about 120° or less and the relative signal intensity S is 0.4 or more, it is possible to reduce the N/2 artifact in the fast flow of the systole.

Therefore, the above-described magnetic resonance imaging apparatus 20 extracts a preferable blood flow image by shifting the phases of the exciting pulse and the refocusing pulse on the basis of the flow velocity of the blood flow. Therefore, according to the above magnetic resonance imaging apparatus 20, it is possible to obtain high intensity signal from a blood vessel that is an object to be extracted, at any time by applying an angle offset that is optimized on the basis of the flow velocity. Further, since the N/2 artifact is reduced and the vein blood vessel is suppressed, the precision of the separation of the artery and the vein can be improved.

Figure 9:
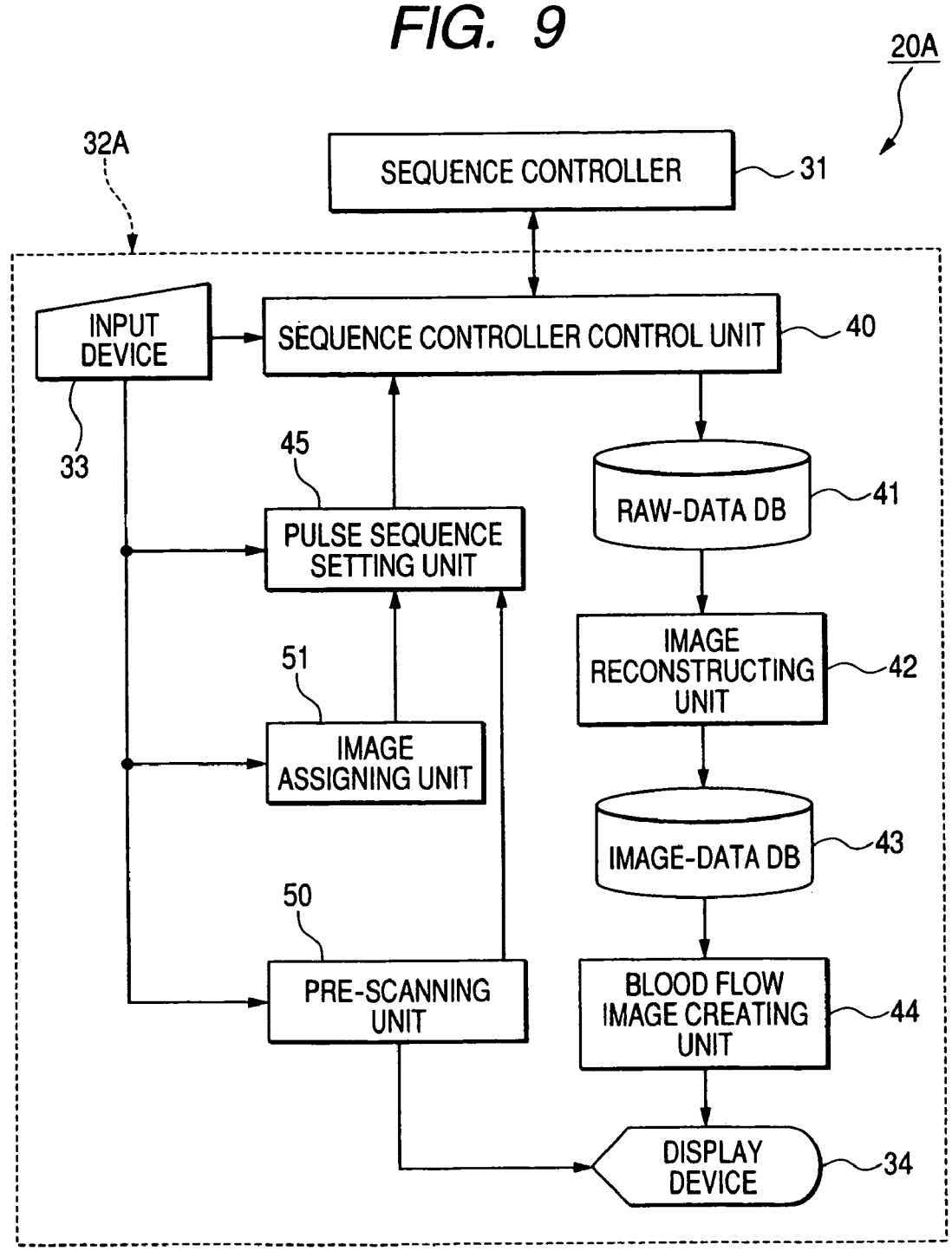
FIG. 9 is a functional block diagram of a computer a magnetic resonance imaging apparatus according to a second embodiment of the invention.

FIG. 9 is a functional block diagram of a computer a magnetic resonance imaging apparatus according to a second embodiment of the invention.

The magnetic resonance imaging apparatus 20A shown in FIG. 9 is different from the magnetic resonance imaging apparatus 20 shown in FIG. 1 in that a pre-scan is performed by the function of a computer 32A so as to obtain an appropriate angle offset. Since the other configuration and operations are not substantially different from the magnetic resonance imaging apparatus 20 shown in FIG. 1, only the functional block diagram of the computer 32A is shown. The same elements are denoted by the same reference numerals, and the description thereof will be omitted.

The computer 32A of the magnetic resonance imaging apparatus 20A includes a pre-scanning unit 50 and an image assigning unit 51 in addition to the same elements as the computer 32 shown in FIG. 2.

The pre-scanning unit 50 has a function of supplying an indication of performing the pre-scan of gradually and repeatedly changing one or both of the angle offset $d\phi$ and the intensity G of the gradient pulse in the RO direction and acquiring data, to the pulse sequence setting unit 45.

Figure 10:
FIG. 10 is a view sequentially showing a pre-scan and an imaging scan that are preformed by using the magnetic resonance imaging apparatus of FIG. 9.

FIG. 10 is a view sequentially showing a pre-scan and an imaging scan that are preformed by using the magnetic resonance imaging apparatus 20A of FIG. 9.

As shown in FIG. 10, the pre-scan is performed prior to an imaging scan for acquiring the blood flow image. During the pre-scan, one or both of the angle offset $d\phi$ and the intensity G of the gradient pulse in the RO direction is changed to be obtained a plurality of blood flow image for a reference. Therefore, the reference images are blood flow images whose signal intensities are varied depending on the angle offset $d\phi$ and the intensity G of the gradient pulse in the RO direction. Therefore, the User can select a blood flow image in which the signal intensity is preferable and the desired blood flow is represented, from the plurality of reference blood images obtained in the pre-scan. By selecting the blood flow image, it is possible to determine the suitable angle offset $d\phi$ and the suitable intensity G of the gradient pulse in the RO direction.

The signal intensities of the blood flows in the blood flow images obtained by the pre-scan are also uniformly varied on the basis of the flow velocity of the blood flow. Thus, the respective blood flow images can indirectly show the flow velocity as the blood flow drawing function. Therefore, the blood flow image to be selected is changed depending on the flow velocity, and as a result, the angle offset dφ and the intensity G of the gradient pulse in the RO direction are determined depending on the flow velocity.

Capturing conditions in the pre-scan such as a changeable range and a changed amount of the angle offset dφ and the intensity G of the gradient pulse in the RO direction, the number of imaging in the pre-scan, the kind of the pulse sequence to be used, etc. is supplied from the input device 33 to the pre-scanning unit 50 as start indication information. Therefore, the pre-scanning unit 50 further has a function of allowing the display device 34 to display a set screen for setting the capturing conditions for the pre-scanning.

Further, if the pulse sequence used in the pre-scan is set to the same kind of the pulse sequence as the pulse sequence used for the imaging scan for obtaining the blood flow image, since a reference image is obtained on the basis of the same capturing conditions, it is possible to select a more suitable image. However, in order to reduce the scanning time, when the imaging scan is three dimensional scan, the pre-scan may be two dimensional scan.

The capturing condition for the pre-scan set as described above is notified from the pre-scanning unit 50 to the pulse sequence setting unit 45, and the pulse sequence setting unit 45 creates a pulse sequence corresponding to the set capturing condition.

The image assigning unit 51 has a function of obtaining image assigning information indicating which image is selected from a plurality of reference images captured in the pre-scan, from the input device 33, and supplying the obtained image assigning information to the pulse sequence setting unit 45.

Therefore, the pulse sequence setting unit 45 has a function of searching the angle offset dφ and the intensity G of the gradient pulse in the RO direction used when imaging the selected reference image during the pre-scan, on the basis of the image assigning information received from the image assigning unit 51, and a function of setting a pulse sequence for the imaging scan using the found angle offset dφ and the intensity G of the gradient pulse in the RO direction.

Figure 11:
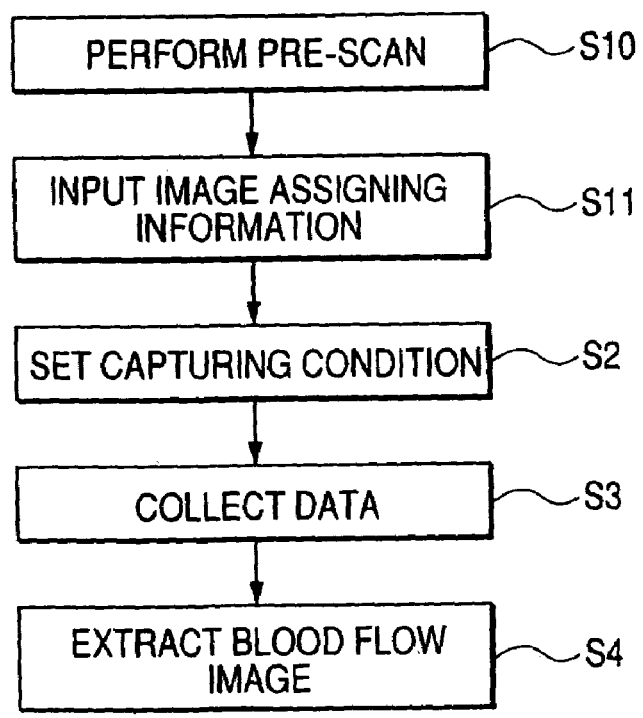
FIG. 11 is a flow chart showing an example of a flow when imaging an MRA image using the magnetic resonance imaging apparatus of FIG. 9 after performing a pre-scan.

FIG. 11 is a flow chart showing an example of a flow when imaging an MRA image using the magnetic resonance imaging apparatus 20A of FIG. 9 after performing the pre-scan. In the drawing, reference symbols S attached with numerals indicate the respective steps of the flow chart. Further, the description of the same reference symbols as that of FIG. 6 will be omitted.

First, in step S10, information indicating the start of the pre-scan is input from the input device 33 to the pre-scanning unit 50. The information indicating the start of the pre-scan includes information such as the changeable range of the angle offset dφ and the intensity G of the gradient pulse in the RO direction, the number of imaging, etc. Further, even though the kind of the pulse sequence used in the pre-scan is included, it is preferable to set to the same kind of the pulse sequence as that of the imaging scan for obtaining the blood flow image. Further, when the pre-scan is two dimensional scan, it is possible to reduce the scanning time.

The pre-scanning unit 50 notifies the indication of performing the pre-scan according to the set capturing condition to the pulse sequence setting unit 45. The pulse sequence setting unit 45 sets a pulse sequence for the pre-scan on the basis of the indication of starting the pre-scan received from the pre-scanning unit 50. The set pulse sequence is output from the pulse sequence setting unit 45 to the sequence controller 31 through the sequence controller control unit 40, and the pre-scan is performed by the sequence controller 31.

Raw data obtained in the pre-scan is disposed in the k space formed in the raw-data database 41. By performing blood flow image creating process such as the image reconstruction process on the raw data using the image reconstructing unit 42 and the difference process or the MIP process using the blood flow image creating unit 44, a plurality of blood flow images obtained by changing the angle offset dφ and the intensity G of the gradient pulse in the RO direction are created. The respective blood flow images created by the blood flow image creating unit 44 is displayed on the display device 34.

The respective blood flow images displayed on the display device 34 represent the blood vessel with different signal intensities due to the different angle offset dφ and intensity G of the gradient pulse in the RO direction. The user selects a blood flow image in which the N/2 artifact is most reduced and the artery is satisfactorily represented, from the displayed blood flow images.

In step S11, the user inputs image indication information indicating the selected blood flow image from the input device. 33 to the image assigning unit 51. The image assigning unit 51 supplies the image indication information from the input device 33 to the pulse sequence setting unit 45.

Next, in step S2, the pulse sequence setting unit 45 sets a pulse sequence for the imaging scan. In this case, the angle offset dφ and the intensity G of the gradient pulse in the RO direction is set to a value used when the blood flow image assigned by the image assigning information is captured during the pre-scan.

The imaging scan is performed according to the same processes as the step S3 to step S4 of FIG. 6 to generate and display the blood flow image.

Since the generated blood flow image is captured according to the same capturing conditions as the capturing conditions of the blood flow image in which the blood flow is satisfactorily represented during the pre-scan, the N/2 artifact is reduced and the vein and the artery are preferably distinguished from each other.

Accordingly, instead of determining the angle offset dφ and the intensity G of the gradient pulse in the RO direction on the basis of the flow velocity of the blood flow, the above magnetic resonance imaging apparatus 20A performs the prescan that obtains the plurality of images by changing the angle offset dφ and the intensity G of the gradient pulse in the RO direction, and refers the plurality of blood flow images obtained in the pre-scan to determine the suitable angle offset dφ and the suitable intensity G of the gradient pulse in the RO direction.

Therefore, according to the magnetic resonance imaging apparatus 20A, even when the flow velocity of the blood flow is unclear, it is possible to indirectly determine a suitable angle offset dφ and a suitable intensity G of the gradient pulse in the RO direction corresponding to the flow velocity, by referring the blood flow image obtained by the pre-scan. It may be further possible to appropriately separate the vein and the artery at the time of generating the blood flow image, and to reduce the N/2 artifact.

Figure 12:
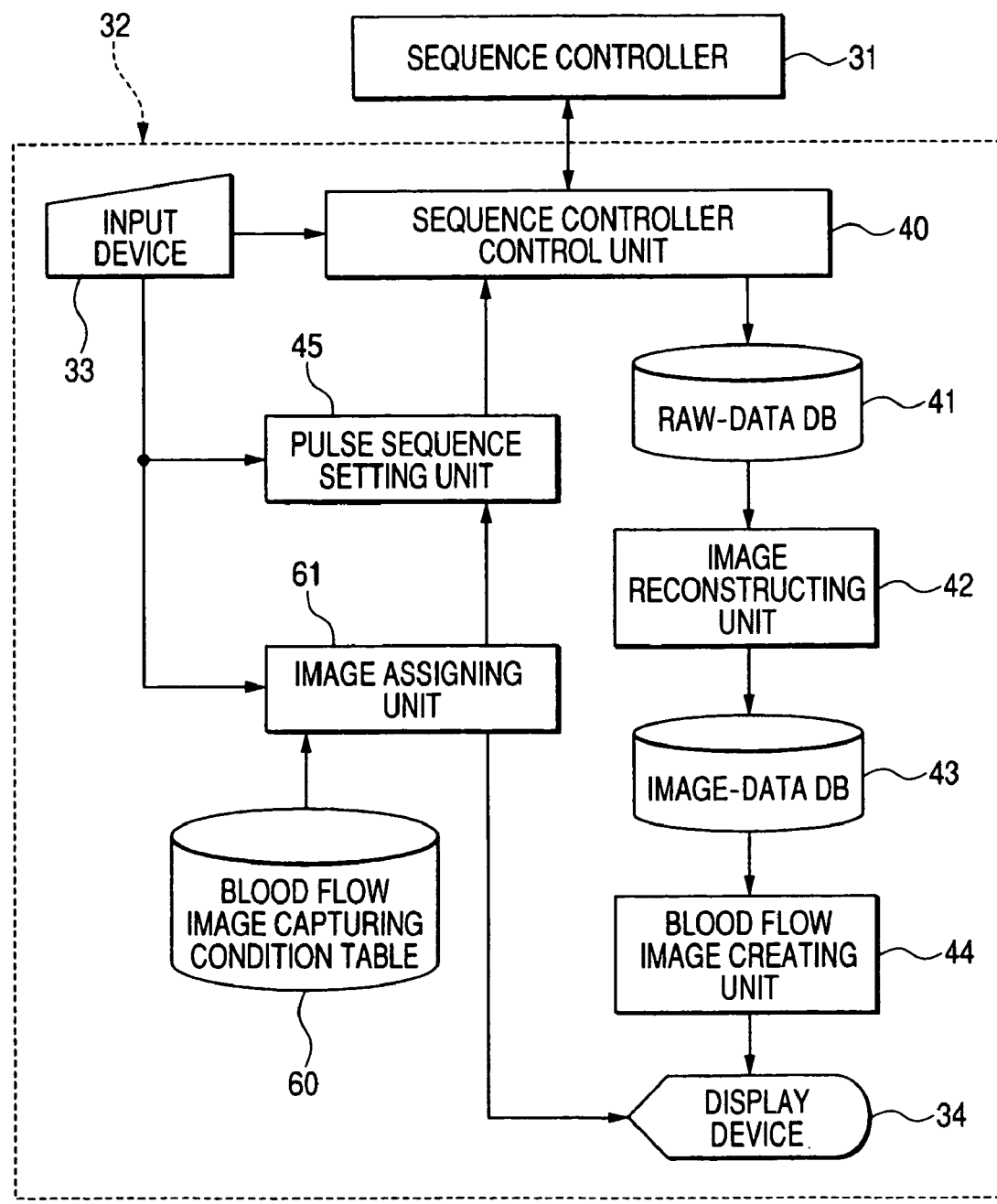
FIG. 12 is a functional block diagram of a computer a magnetic resonance imaging apparatus according to a third embodiment of the invention.

FIG. 12 is a functional block diagram of a computer a magnetic resonance imaging apparatus according to a third embodiment of the invention.

The magnetic resonance imaging apparatus 20B shown in FIG. 12 is different from the magnetic resonance imaging apparatus 20 shown in FIG. 1 in that a blood flow image capturing condition table 60 and a blood flow image capturing condition indicating unit 61, instead of the blood flow velocity acquiring unit 46, are provided in a computer 32B. Since the other configuration and operations are not substantially different from the magnetic resonance imaging apparatus 20 shown in FIG. 1, only the functional block diagram of the computer 32B is shown. The same elements are denoted by the same reference numerals, and the description thereof will be omitted.

The computer 32A of the magnetic resonance imaging apparatus 20B includes the blood flow image capturing condition table 60 and the blood flow image capturing condition indicating unit 61 in addition to the same elements as the computer 32 shown in FIG. 2.

In the blood flow image capturing condition table 60, the angle offset dϕ and the intensity G of the gradient pulse in the RO direction are previously stored so as to be associated with capturing conditions such as a capturing portion or an intensity of the static magnetic field. Even though the angle offset dϕ and the intensity G of the gradient pulse in the RO direction are set on the basis of the blood velocity, it is possible to set the suitable angle offset dϕ and the suitable intensity G of the gradient pulse in the RO direction by estimating the flow velocity of the blood flow without obtaining the real flow velocity of the blood flow.

For example, it is known that the blood flow velocity gradually decreases in the order of the chest, the abdomen, and the legs. Therefore, when ignoring that the blood flow velocity is varied depending on the object, it is possible to estimate the blood flow velocity for each capturing portion. That is, when a capturing portion is selected during a capturing schedule, since a blood flow velocity in the selected capturing portion is unambiguously estimated, it is possible to determine the suitable angle offset dϕ and the suitable intensity G of the gradient pulse in the RO direction.

For example, the angle offset dϕ and the intensity G of the gradient pulse in the RO direction that are suitable for each of the capturing portion such as the chest, the abdomen, and the legs to be selected as the capturing condition in the capturing schedule are determined. Therefore, the angle offset dϕ and the intensity G of the gradient pulse in the RO direction associated with the respective capturing portions are stored in the blood flow image capturing condition table 60. In this case, instead of the angle offset dϕ, the transmitting phase of the exciting pulse and the refocusing pulse can be associated with the capturing condition. Hereinafter, the association of the angle offset dϕ with the capturing condition will be described.

There is a possibility that the change of the signal intensity as shown in FIG. 4 is changed depending on the intensity of the static magnetic field formed by the static magnetic field magnet 21. In this case, it is possible to suitably determine the angle offset dϕ and the intensity G of the gradient pulse in the RO direction every intensity of the flow velocity and store them in the blood flow image capturing condition table 60. As a device with the standard intensity of the static magnetic field, devices of 0.5 T, 1.0 T, 1.5 T, and 3.0 T are sold on the market.

The blood flow image capturing condition indicating unit 61 includes a GUI (graphical user interface), has a function of displaying a testing screen on the display device 34, and setting the capturing condition of the blood flow image on the basis of the indication information from the input device 33, and a function of obtaining the angle offset dϕ and the intensity G of the gradient pulse in the RO direction that are suitable for the capturing condition set from the blood flow image capturing condition table 60 to supply to the pulse sequence setting unit 45 together with the capturing condition.

On a general testing screen, an appropriate capturing condition is selected from candidates of the imaging conditions that are hierarchically displayed from the broader concept to the narrower concept, corresponding to the diagnostic purpose. Specifically, the candidates of capturing portions such as the chest, the abdomen, the lets, etc. are displayed, and the capturing portion is selected by manipulating the input device 33 such as a mouse. Therefore, the candidate of the capturing condition such as the pulse sequence that is suitable for the selected capturing portion is selectively displayed.

When the capturing portion is selected, it is possible to set the angle offset dϕ and the intensity G of the gradient pulse in the RO direction that are suitable for the capturing condition set by the blood flow image capturing condition table 60, as one of the capturing condition. In this case, the angle offset dϕ and the intensity G of the gradient pulse in the RO direction may be displayed on the display device 34 as a reference, in addition to the blood flow velocity corresponding to the selected capturing portion.

As a method of displaying the angle offset dϕ and the intensity G of the gradient pulse in the RO direction, in addition of the method of displaying only the selected the angle offset dϕ and the intensity G of the gradient pulse in the RO direction, a method of displaying a plurality of angle offsets dϕ and intensities G of the gradient pulse in the RO direction stored in the blood flow image capturing condition table 60, and highlighting the selected angle offset dϕ and the selected intensity G of the gradient pulse in the RO direction is exemplified.

Further, when there are a plurality of candidates of the suitable angle offset dϕ and the suitable intensity G of the gradient pulse in the RO direction, the candidates of the angle offset dϕ and the intensity G of the gradient pulse in the RO direction may be displayed on the display device 34 to be selected.

The pulse sequence setting unit 45 may be configured to set the pulse sequence at the angle offset dϕ and the intensity G of the gradient pulse in the RO direction acquired from the blood flow image capturing condition unit 61.

According to the magnetic resonance imaging apparatus 20B with the above configuration, if a condition such as the intensity of the static magnetic field or the capturing portion is set, it is possible to automatically set the suitable angle offset dϕ and the suitable intensity G of the gradient pulse in the RO direction without considering the blood flow velocity, the angle offset dϕ (or the transmitting phase of the exciting pulse and the refocusing pulse) and the intensity G of the gradient pulse in the RO direction. Therefore, it is possible to perform the FBI using the automatically set angle offset dϕ and intensity G of the gradient pulse in the RO direction.

Therefore, according to the magnetic resonance imaging apparatus 20B, in step S2 of the flow chart shown in FIG. 6, when other capturing conditions such as the capturing portion are set at the time of setting the capturing conditions, it is possible to acquire data and represent the blood flow image in steps S3 and S4.

Therefore, according to the magnetic resonance imaging apparatus 20B, it is possible to simply create the blood flow image at a short time without operations such as acquisition of the blood flow velocity or pre-scan.

It is further possible to implement a magnetic resonance imaging apparatus having a plurality of desired functions selected among the functions of the respective magnetic resonance imaging apparatuses 20, 20A, and 20B according to the respective embodiments. For example, when the flow velocity of the blood flow is known, the capturing condition is set on the basis of the flow velocity. It is further possible to configure the magnetic resonance imaging apparatus so as to set the suitable capturing condition, by indicating the pre-scan or the capturing portion when the flow velocity of the blood flow is unclear.

What is claimed is:

1. A magnetic resonance imaging apparatus comprising:
    a blood flow velocity acquiring unit that acquires a flow velocity of the blood flow of an object;
    an imaging condition setting unit configured to set on the basis of the flow velocity of the blood flow acquired by the blood flow velocity acquiring unit, at least one of (a) a transmitting phase of a transmitted exciting pulse, (b) a transmitting phase of a refocusing pulse, (c) a shift amount of the relative phase difference between the transmitted exciting phase and the refocusing pulse, and (d) an intensity of a gradient pulse in a readout direction as an imaging condition;

said capturing condition setting unit is configured to perform the setting such that (i) intensities of magnetic resonance signals generated from a vein in a diastole and a systole of the cardiac muscle of the object are equal to each other, and (ii) the difference between intensities of magnetic resonance signals generated from an artery in a diastole and a systole of the cardiac muscle of the object increases; and a blood flow image capturing unit that creates a blood flow image of the object by performing an imaging scan on the basis of the imaging condition set by the imaging condition setting unit.

2. The magnetic resonance imaging apparatus according to claim 1, wherein:

the imaging condition setting unit sets the at least one of (a) the transmitting phase of the transmitted exciting pulse, (b) the transmitting phase of the refocusing pulse, and (c) the shift amount such that an intensity of a magnetic resonance signal generated from a vein of the object increases.

3. The magnetic resonance imaging apparatus according to claim 1, wherein:

the imaging condition setting unit sets the intensity of the gradient pulse such that an intensity of a magnetic resonance signal generated from an artery of the object is larger than a predetermined intensity.

4. The magnetic resonance imaging apparatus according to claim 1, wherein:

the blood flow image capturing unit creates a blood flow image so as to display at least one of a vein and an artery in recognizable colors.

5. The magnetic resonance imaging apparatus according to claim 1, wherein:

the blood flow image capturing unit detects vein data by performing a threshold process, which uses an upper limit and a lower limit, on data except for artery data among three-dimensional image data in a diastole obtained by the imaging scan.

6. A magnetic resonance imaging apparatus comprising:

a pre-scanning unit that performs a pre-scan that collects a plurality of reference blood flow images by varying at least one of (a) a transmitting phase of a transmitted exciting pulse, (b) a transmitting phase of a refocusing pulse, (c) a shift amount of the relative phase difference between the transmitted exciting phase and the refocusing pulse, and (d) an intensity of a gradient pulse in a readout direction;

an imaging condition setting unit configured to set an imaging condition using (a) the transmitting phase of the transmitted exciting pulse, (b) the transmitting phase of the refocusing pulse, (c) the shift amount of the relative phase difference between the transmitted exciting phase and the refocusing pulse, and (d) the intensity of a gradient pulse in a readout direction that are used for an image selected from the plurality of the reference blood flow images;

said capturing condition setting unit is configured to perform the setting such that (i) intensities of magnetic resonance signals generated from a vein in a diastole and a systole of the cardiac muscle of the object are equal to each other, and (ii) the difference between intensities of magnetic resonance signals generated from an artery in a diastole and a systole of the cardiac muscle of the object increases; and a blood flow image capturing unit that creates a blood flow image of the object by performing an imaging scan on the basis of the imaging condition set by the imaging condition setting unit.

7. A magnetic resonance imaging apparatus, comprising:

a storage unit that stores at least one of (a) a transmitting phase of a transmitted exciting pulse, (b) a transmitting phase of a refocusing pulse, (c) a shift amount of the relative phase difference between the transmitted exciting phase and the refocusing pulse, and (d) an intensity of a gradient pulse in a readout direction so as to be associated with at least one of an imaging condition and a blood flow velocity;

an imaging condition determining unit configured to determine on the basis of the at least one of (a) the transmitting phase of the transmitted exciting pulse, (b) the transmitting phase of the refocusing pulse, (c) the shift amount, and (d) the intensity of the gradient pulse that are stored in the storage unit, determines the at least one of (a) the transmitting phase of the transmitted exciting pulse, (b) the transmitting phase of the refocusing pulse, (c) the shift amount of the relative phase difference between the transmitted exciting phase and the refocusing pulse, and (d) the intensity of the gradient pulse in the readout direction corresponding to the blood flow velocity of the object as an imaging condition;

said capturing condition determining unit is configured to perform the determining such that (i) intensities of magnetic resonance signals generated from a vein in a diastole and a systole of the cardiac muscle of the object are equal to each other, and (ii) the difference between intensities of magnetic resonance signals generated from an artery in a diastole and a systole of the cardiac muscle of the object increases;

an imaging unit that performs a three-dimensional imaging scan for obtaining a multi-phase MRA image by synchronizing a signal representing a heart phase collected by a time phase detecting unit on the basis of the imaging condition determined by the imaging condition determining unit; and a data processing unit that obtains a differential image by differentiating the multi-phase MRA image obtained by the three-dimensional imaging scan.

8. The magnetic resonance imaging apparatus according to claim 7, wherein:

the data processing unit differentiates an MRA image in the diastole and an MRA image in the systole as a multi-phase MRA image and acquires an MRA image in which the vein and the artery are distinguished as the differentiated image.

9. The magnetic resonance imaging apparatus according to claim 7, wherein:

the imaging unit controls a gradient magnetic field on the basis of the imaging condition and performs the scan by encoding a frequency in a moving direction of the blood vessel of the object.

10. The magnetic resonance imaging apparatus according to claim 7, wherein:

the storage unit stores the at least one of (a) the transmitting phase of the transmitted exciting pulse, (b) the transmitting phase of the refocusing pulse, (c) the shift amount, and (d) the intensity of the gradient pulse so as to be associated with at least one imaging condition; and the imaging condition determining unit includes a graphical user interface to select at least one of the imaging condition and the blood flow velocity.

11. A magnetic resonance imaging method comprising:
acquiring a flow velocity of the blood flow of an object;
setting, on the basis of the acquired flow velocity of the blood flow, at least one of (a) a transmitting phase of a transmitted exciting pulse, (b) a transmitting phase of a refocusing pulse, (c) a shift amount of the relative phase difference between the transmitted exciting phase and the refocusing pulse, and (d) an intensity of a gradient pulse in a readout direction as an imaging condition such that (i) intensities of magnetic resonance signals generated from a vein in a diastole and a systole of the cardiac muscle of the object are equal to each other and (ii) the difference between intensities of magnetic resonance signals generated from an artery in a diastole and a systole of the cardiac muscle of the object increases; and
creating a blood flow image of the object by performing an imaging scan on the basis of the set imaging condition.

12. The magnetic resonance imaging method according to claim 11, wherein:
the at least one of (a) the transmitting phase of the transmitted exciting pulse, (b) the transmitting phase of the refocusing pulse, and (c) the shift amount is set such that an intensity of a magnetic resonance signal generated from a vein of the object increases.

13. The magnetic resonance imaging method according to claim 11, wherein:
the intensity of the gradient pulse is set such that an intensity of a magnetic resonance signal generated from an artery of the object is equal or larger than a predetermined intensity.

14. The magnetic resonance imaging method according to claim 11, wherein:
a blood flow image is created so as to display at least one of a vein and an artery in recognizable colors.

15. The magnetic resonance imaging method according to claim 11, wherein:
vein data is detected by performing a threshold process, which uses an upper limit and a lower limit, on data except for artery data among three-dimensional image data in a diastole obtained by the imaging scan.

16. A magnetic resonance imaging method comprising:
performing a pre-scan that collects a plurality of reference blood flow images by varying at least one of (a) a transmitting phase of a transmitted exciting pulse, (b) a transmitting phase of a refocusing pulse, (c) a shift amount of the relative phase difference between the transmitted exciting phase and the refocusing pulse, and (d) an intensity of a gradient pulse in a readout direction such that (i) intensities of magnetic resonance signals generated from a vein in a diastole and a systole of the cardiac muscle of the object are equal to each other, and (ii) the difference between intensities of magnetic resonance signals generated from an artery in a diastole and a systole of the cardiac muscle of the objects increases;
setting an imaging condition using (a) the transmitting phase of the transmitted exciting pulse, (b) the transmitting phase of the refocusing pulse, (c)the shift amount of the relative phase difference between the transmitted exciting phase and the refocusing pulse, and (d) the intensity of a gradient pulse in a readout direction that are used for an image selected from the plurality of the reference blood flow images such that (i) intensities of magnetic resonance signals generated from a vein in a diastole and a systole of the cardiac muscle of the objects are equal to each other and (ii) the difference between intensities of magnetic resonance signals generated from an after in a diastole and a systole of the cardiac muscle of the objects increases; and
creating a blood flow image of the object by performing an imaging scan on the basis of the imaging condition set by the imaging condition setting unit.

17. A magnetic resonance imaging method comprising:
storing at least one of (a) a transmitting phase of a transmitted exciting pulse, (b) a transmitting phase of a refocusing pulse, (c) a shift amount of the relative phase difference between the transmitted exciting phase and the refocusing pulse, and (d) an intensity of a gradient pulse in a readout direction so as to be associated with at least one of an imaging condition and a blood flow velocity;
determining, on the basis of the at least one of (a) the transmitting phase of the transmitted exciting pulse, (b) the transmitting phase of the refocusing pulse, (c) the shift amount, and (d) the intensity of the gradient pulse that are stored in the storage unit, the at least one of (a) the transmitting phase of the transmitted exciting pulse, (b) the transmitting phase of the refocusing pulse, (c) the shift amount of the relative phase difference between the transmitted exciting phase and the refocusing pulse, and (d) the intensity of the gradient pulse in the readout direction corresponding to the blood flow velocity of the object as an imaging condition such that (i) intensities of magnetic resonance signals generated from a vein in a diastole and a systole of the cardiac muscle of the objects are equal to each other and (ii) the difference between intensities of magnetic resonance signals generated from an artery in a diastole and a systole of the cardiac muscle of the objects increases;
performing a three-dimensional imaging scan for obtaining a multi-phase MRA image by synchronizing a signal representing a heart phase collected by a time phase detecting unit on the basis of the determined imaging condition; and
acquiring a differential image by differentiating the multi-phase MRA image obtained by the three-dimensional imaging scan.

18. The magnetic resonance imaging method according to claim 17, wherein:
an MRA image in the diastole and an MRA image in the systole are differentiated as a multi-phase MRA image and an MRA image in which the vein and the artery are distinguished is acquired as the differentiated image.

19. The magnetic resonance imaging method according to claim 17, wherein:
a gradient magnetic field is controlled on the basis of the imaging condition and the scan is performed by encoding a frequency in a moving direction of the blood vessel of the object.

20. The magnetic resonance imaging method according to claim 17, wherein:
the at least one of (a) the transmitting phase of the transmitted exciting pulse, (b) the transmitting phase of the refocusing pulse, (c) the shift amount, and (d) the intensity of the gradient pulse is stored to be associated with at least one imaging condition; and
at least one of the imaging condition and the blood flow velocity is selected by using a graphical user interface.

* * * * *